United States Patent
Wang et al.

(10) Patent No.: US 10,938,360 B1
(45) Date of Patent: *Mar. 2, 2021

(54) MULTIMODE MULTIBAND WIRELESS DEVICE WITH BROADBAND POWER AMPLIFIER

(71) Applicant: Micro Mobio Corporation, Palo Alto, CA (US)

(72) Inventors: Adam James Wang, Palo Alto, CA (US); Zlatko Aurelio Filipovic, San Jose, CA (US); Ikuroh Ichitsubo, Sagamihara (JP); Kanya Kubota, Higashi-Omi (JP)

(73) Assignee: Micro Mobio Corporation, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/980,679

(22) Filed: May 15, 2018

Related U.S. Application Data

(63) Continuation-in-part of application No. 15/607,471, filed on May 27, 2017, now Pat. No. 9,973,159,
(Continued)

(51) Int. Cl.
*H03F 3/24* (2006.01)
*H04B 1/403* (2015.01)
(Continued)

(52) U.S. Cl.
CPC .............. *H03F 3/245* (2013.01); *H03F 1/305* (2013.01); *H03F 3/195* (2013.01); *H04B 1/406* (2013.01); *H04B 1/525* (2013.01)

(58) Field of Classification Search
CPC ............ H04B 2203/5416; H04B 3/542; H04B 7/0602; H04B 1/0053; H04B 1/006; H04B 1/0458; H04B 1/0475; H04B 1/10; H04B 1/1027; H04B 1/16; H04B 7/0404; H04B 2001/0408; H04B 1/0035; H04B 1/3833; H04B 1/62; H04B 7/1851; H04W 52/246; H04W 52/26; H04W 52/265; H04W 52/283; H04W 48/10; H04W 88/02; H04W 88/06; H04W 88/10; H01L 2924/00014; H01L 2924/00; H01L 21/02381; H01L 21/02488; H01L 21/02505; H01L 21/02521; H01L 21/02513; H01L 27/0605;
(Continued)

(56) References Cited

U.S. PATENT DOCUMENTS 3,903,485 A   9/1975   Dolby
4,422,047 A   12/1983  Wright
(Continued)

OTHER PUBLICATIONS

An Introduction to Millimeter-Wave Mobile Broadband systems—by Zhouyue Pi and Farooz Khan, Samsung Electronics—IEEE Communications Magazine—Jun. 2011, pp. 101-107.*

*Primary Examiner* — Nimesh Patel
(74) *Attorney, Agent, or Firm* — Roark IP

(57) ABSTRACT

A multimode multiband wireless device includes a broadband RF power amplifier that receives RF signals and produces amplified RF signals in a cellular band in a broadband, and a coexist filter coupled to the input of the broadband RF power amplifier. The coexist filter can reject RF noise in a predetermined frequency range in the broadband adjacent to the cellular band.

20 Claims, 33 Drawing Sheets

Related U.S. Application Data which is a continuation of application No. 13/282,449, filed on Oct. 26, 2011, now Pat. No. 9,667,306.

(51) Int. Cl.
  *H03F 3/195* (2006.01)
  *H03F 1/30* (2006.01)
  *H04B 1/525* (2015.01)

(58) Field of Classification Search
  CPC ....... H01L 21/8258; H01L 2224/32225; H01L 2224/16225; H01L 2224/49175; H03F 3/245; H03F 3/195; H03F 3/20; H03F 3/68
  See application file for complete search history.

(56) References Cited

U.S. PATENT DOCUMENTS

| | | | |
|---|---|---|---|
| 4,539,566 A | 9/1985 | Sharpe et al. | |
| 4,977,041 A | 12/1990 | Shiozawa | |
| 4,987,605 A | 1/1991 | Nose | |
| 5,450,090 A | 9/1995 | Gels | |
| 5,525,942 A | 6/1996 | Horii | |
| 5,656,972 A | 8/1997 | Norimatsu | |
| 5,694,414 A | 12/1997 | Smith et al. | |
| 5,880,635 A | 3/1999 | Stash | |
| 5,923,289 A | 7/1999 | Buer | |
| 6,025,651 A | 2/2000 | Nam | |
| 6,118,991 A | 9/2000 | Jean et al. | |
| 6,151,509 A | 11/2000 | Chorey | |
| 6,262,630 B1 | 7/2001 | Eriksson | |
| 6,449,264 B1 | 9/2002 | Lehtinen et al. | |
| 6,462,622 B1 | 10/2002 | Mori | |
| 6,611,696 B2 * | 8/2003 | Chedester | G01V 8/005 |
| | | | 342/359 |
| 6,625,050 B2 | 9/2003 | Suva | |
| 6,665,546 B2 * | 12/2003 | Slaughter | H01Q 1/125 |
| | | | 370/310 |
| 6,678,506 B1 | 1/2004 | Dolman | |
| 6,798,287 B2 | 9/2004 | Wu | |
| 7,062,293 B2 * | 6/2006 | Johnson | H01Q 1/125 |
| | | | 455/561 |
| 7,157,966 B2 | 1/2007 | Baree | |
| 7,444,124 B1 | 10/2008 | Loeb | |
| 7,515,916 B1 | 4/2009 | Alexander | |
| 9,667,306 B2 * | 5/2017 | Wang | H04B 1/525 |
| 9,973,159 B1 * | 5/2018 | Wang | H04B 1/525 |
| 2002/0164957 A1 * | 11/2002 | Lovberg | H01Q 1/125 |
| | | | 455/73 |
| 2002/0180639 A1 * | 12/2002 | Rickett | H01Q 3/22 |
| | | | 342/372 |
| 2003/0122079 A1 | 7/2003 | Pobanz | |
| 2003/0201827 A1 | 10/2003 | Ohnishi | |
| 2004/0127185 A1 | 7/2004 | Abrahams | |
| 2004/0203552 A1 | 10/2004 | Horiuchi | |
| 2004/0266371 A1 | 12/2004 | Summers | |
| 2005/0174173 A1 | 8/2005 | Blodgett | |
| 2005/0189990 A1 | 9/2005 | Mizuta | |
| 2005/0239415 A1 | 10/2005 | Sagae | |
| 2006/0097783 A1 | 5/2006 | Okubo | |
| 2006/0132232 A1 | 6/2006 | Baree | |
| 2007/0067808 A1 * | 3/2007 | DaCosta | H04N 7/17318 |
| | | | 725/62 |
| 2007/0190952 A1 | 8/2007 | Waheed | |
| 2007/0225033 A1 | 9/2007 | Yoon | |
| 2007/0243832 A1 | 10/2007 | Park et al. | |
| 2008/0040885 A1 | 2/2008 | Daoud | |
| 2008/0062856 A1 | 3/2008 | Feher | |
| 2008/0218270 A1 | 9/2008 | Hau | |
| 2008/0299759 A1 | 12/2008 | Chatterjee | |
| 2008/0303121 A1 | 12/2008 | Lin | |
| 2009/0068974 A1 | 3/2009 | Smith | |
| 2009/0213768 A1 | 9/2009 | Jeong et al. | |
| 2010/0034316 A1 * | 2/2010 | Korevaar | H04L 27/2039 |
| | | | 375/308 |
| 2010/0117738 A1 | 5/2010 | Korden | |
| 2010/0144286 A1 | 6/2010 | Sorenson | |
| 2011/0057730 A1 * | 3/2011 | Makioka | H03F 1/32 |
| | | | 330/295 |
| 2011/0117862 A1 * | 5/2011 | Bagger | H04B 1/0057 |
| | | | 455/77 |
| 2012/0128167 A1 | 5/2012 | Tanaka | |
| 2013/0057432 A1 * | 3/2013 | Rajagopal | H01Q 3/26 |
| | | | 342/368 |
| 2013/0137381 A1 | 5/2013 | Vassiliou | |
| 2016/0035696 A1 | 2/2016 | Tao | |
| 2018/0184326 A1 * | 6/2018 | Ben-Haim | H04W 28/06 |

* cited by examiner

MULTIMODE MULTIBAND WIRELESS DEVICE WITH BROADBAND POWER AMPLIFIER

CROSS REFERENCES TO RELATED APPLICATIONS

The present application is a Continuation-In-Part of U.S. patent application Ser. No. 15/607,471, filed on May 27, 2017; which is a Continuation of U.S. patent application Ser. No. 13/282,449, filed on Oct. 26, 2011; the aforementioned applications being incorporated by reference in their entirety for all purposes.

BACKGROUND OF THE INVENTION

The present invention relates to wireless communication technologies, and in particular, to multimode multiband wireless devices.

In modern wireless communications, wireless signals transmitted by mobile devices are regulated in frequency bands defined in various standards and protocols. For example, Universal Mobile Telecommunications System (UMTS) and evolved UMTS Terrestrial Radio Access (E-UTRA) define many of these cellular bands for mobile communications, as shown in FIGS. 1A-1D. Different cellular bands typically utilize different amplifiers, which require multiple power amplifiers in a multi-band wireless device. The proliferation of cellular bands has increased the number of power amplifiers, and thus the costs and sizes of the wireless devices.

A serious challenge to mobile RF communications is that wireless devices services operate in multiple bands that can interfere with each other and with other wireless services. Examples of other wireless services include WiFi, global positioning system (GPS), satellite digital audio radio (SDARS), digital terrestrial television (DTV), digital video broadcasting (DTB), FM radio, NFC, navigation, and other satellite and terrestrial broadcast services. Many of these services operate immediately adjacent to cellular bands. These other wireless services can generate noises that interfere with mobile RF communications. Moreover, many mobile communication devices provide functions in cellular communications as well as many of these other wireless services. For example, many smart phones can provide mobile RF communications, and also include functionalities for WiFi, Bluetooth, GPS, DTV, FM radio, NFC and other satellite or terrestrial broadcasting and communication services.

In cellular communications, uplink means transmission from terminals to base stations. Downlink means reception from terminals to base stations. There are two types of duplexing for uplink and downlink: frequency-division duplexing (FDD) and time-division duplexing (TDD). In FDD, uplink and downlink use different frequencies. In TDD, uplink and downlink use the same frequency. In this application, the uplink frequencies may be used for FDD bands as illustrative examples.

In the 2.3 GHz to 2.7 GHz frequency range, as shown in FIG. 1A, cellular bands and the WiFi coexist in close frequency range. Specifically, Band 38 (2.570-2.620 GHz), Band 7 (2.500-2.570 GHz), Band 40 (2.300-2.400 GHz), and Band 41 (2.496-2.690 GHz) are very close to the WiFi band (2.400-2.483 GHz) and SDARS band (2.320-2.345 GHz). As shown in FIG. 2A, the RF signals in the cellular Bands 38, 7, 40, 41 amplified by a cellular transmission amplifier 150TX and transmitted by antenna 160 are often coupled into an antenna 110 and an amplifier 100RX in a WiFi receiver, which creates too much noise for the WiFi receiver. Conversely, as shown in FIG. 2B, WiFi signals amplified by the transmission amplifier 100TX and transmitted by the antenna 110 can be coupled into the antenna 160 and the amplifier 150RX in the cellular band circuit, which interferes with the reception of the RF signals in the cellular Bands 38, 7, 40, 41. The interferences between the WiFi band and the cellular bands can prevent mobile devices from simultaneously operating in a cellular network and a wireless local network (WLAN).

Similarly, in the 0.7-1.5 GHz range, as shown in FIG. 1B, DTV CH 51, 52 are right next to cellular bands 12, 17. The noises from these cellular bands circuit can significant affect the reception of DTV signals. Additionally, in the 1.5-2.0 GHz range, as shown in FIG. 1C, GPS frequency (1.575 GHz) is overlap with cellular band 24 downlink frequency (1.525-1.559 GHz). The noises from cellular band can significant affect the reception of GPS signals. There is therefore a need to provide RF signal amplification spanning multiple cellular bands without increasing the number of power amplifiers, device size, and cost. There is also a need to provide wireless communications simultaneously with wireless services such as WiFi, GPS, SDARS, DTV, digital terrestrial television (DTV), FM radio, NFC, satellite navigation, and satellite broadcast.

SUMMARY OF THE INVENTION

An aspect of the present disclosure provides RF wireless communications in frequency ranges also operated by other wireless services such as WiFi, GPS, satellite music, FM radio, digital terrestrial television, digital video broadcasting, navigation, SDARS, DTV, and NFC, etc. The disclosed power amplifying circuit can enable a wireless device to simultaneously communicate in cellular network and perform the other wireless services.

Another aspect of the present disclosure provides RF power amplification in multiple cellular bands, with reduced number of power amplifiers and reduced costs comparing to conventional power amplifier circuit.

In some implementations of the present disclosure, the use of notch filters decreases the number of high Q band pass filters, which also simplifies the power amplifying circuit and reduces costs. A new RF front-end design is also disclosed to further decrease size. The reduction of components in the presently disclosed power amplifier circuits allows higher level of integration and higher level of device miniaturization in wireless devices.

The disclosed broadband linear amplifier circuits are suitable to various wireless communications protocols, such as 3G, 4G, 5G, Long Term Evolution (LTE), LTE Advanced, WiMax, WiBro, WiFi, WLAN and millimeter wave (mm-Wave).

In a general aspects, the present disclosure relates to a multimode multiband wireless device that includes an RF power amplifier that receives RF signals and produces amplified RF signals in a cellular band in a broadband, and a coexist filter coupled to the RF power amplifier. The coexist filter can reject RF noise in a predetermined frequency range in the broadband adjacent to the cellular band.

In another general aspect, the present disclosure relates to a multimode multiband wireless device that includes one or more input terminals each configured to receive an input RF signal; one or more input coexist filters each configured to pass through one of RF signals in a cellular band and reject RF noise outside of the cellular band; a broadband RF power amplifier that can receive RF signals from the one or more input coexist filters or directly from the one or more input terminals and to produce amplified RF signals; one or more output coexist filters each configured to pass through amplified RF signals in a cellular band and reject RF noise outside of the cellular band; and one or more output terminals each configured to receive one of the amplified RF signal from the one or more output coexist filters or directly from the broadband RF power amplifier.

Another aspect of the present disclosure provides a radio frequency (RF) power amplifier wireless device comprising: a semiconductor amplifier substrate having at least one radio frequency (RF) power amplifier configured to amplify an RF signal, wherein said RF signal is in a range of approximately 20 GigaHertz (GHz) to approximately 300 GHz; and an antenna substrate having a plurality of antenna elements coupled to the at least one RF power amplifier and configured to form a mmWave beam.

Another aspect of the present disclosure provides a radio frequency (RF) amplifier wireless device comprising: a first semiconductor amplifier substrate having a first radio frequency (RF) power amplifier configured to operate in a range of approximately 20 GigaHertz (GHz) to approximately 300 GHz; a second semiconductor amplifier substrate further having a second RF power amplifier configured to operate in a range of approximately 400 MHz to 20 GHz; a first antenna substrate coupled to the first semiconductor amplifier substrate; and a second antenna substrate coupled to the second semiconductor amplifier substrate.

Another aspect of the present disclosure provides a radio frequency (RF) amplifier wireless device comprising: a semiconductor amplifier substrate having at least one radio frequency (RF) power amplifier configured to amplify an RF signal, wherein said RF signal is in a range of approximately 20 GigaHertz (GHz) to approximately 300 GHz; wherein the semiconductor substrate further includes a phase shifter and a gain controller coupled to the at least one RF power amplifier; and an antenna substrate having a plurality of antenna elements coupled to the at least one RF power amplifier and configured to form a mmWave beam.

Another aspect of the present disclosure provides a radio frequency (RF) amplifier wireless device comprising: a semiconductor amplifier substrate having a plurality of radio frequency (RF) power amplifiers configured to transmit an RF signal, wherein said RF signal is in a range of approximately 20 GigaHertz (GHz) to approximately 300 GHz; wherein the semiconductor amplifier substrate further includes a plurality of phase controllers to control a plurality of phase shifters which are coupled to the plurality of RF power amplifiers; and an antenna substrate having a plurality of antenna elements coupled to the plurality of RF power amplifiers and configured to form a mmWave beam.

Another aspect of the present disclosure provides a radio frequency (RF) amplifier wireless device, comprising: a semiconductor amplifier substrate having a plurality of radio frequency (RF) low noise amplifiers (LNAs) configured to receive an RF signal, wherein said RF signal is in a range of approximately 20 GigaHertz (GHz) to approximately 300 GHz; wherein the semiconductor amplifier substrate further includes a plurality of phase controllers to control a plurality of phase shifters which are coupled to the plurality of LNAs; and an antenna substrate having a plurality of antenna elements coupled to the plurality of LNAs to receive a mmWave signal.

Another aspect of the present disclosure provides a radio frequency (RF) amplifier wireless device comprising: a semiconductor amplifier substrate having a plurality of radio frequency (RF) power amplifiers configured to transmit an RF signal, wherein said RF signal is in a range of approximately 20 GigaHertz (GHz) to approximately 300 GHz; a beam control module having a phase controller to control a plurality of phase shifters which are coupled to the plurality of RF power amplifiers; and an antenna substrate having a plurality of antenna elements coupled to the plurality of RF power amplifiers and configured to form a mmWave beam.

Another aspect of the present disclosure provides a radio frequency (RF) amplifier wireless device, comprising: a semiconductor amplifier substrate having a plurality of radio frequency (RF) low noise amplifiers (LNAs) configured to receive an RF signal, wherein said RF signal is in a range of approximately 20 GigaHertz (GHz) to approximately 300 GHz; a beam control module having a phase controller to control a plurality of phase shifters which are coupled to the plurality of LNAs; and an antenna substrate having a plurality of antenna elements coupled to the plurality of LNAs and configured to receive a mmWave signal.

BRIEF DESCRIPTION OF THE DRAWINGS

The following drawings, which are incorporated in and from a part of the specification, illustrate embodiments of the present specification and, together with the description, serve to explain the principles of the specification

Figures ID is a schematic diagram illustrating cellular bands operating in the 3.4-3.8 GHz range.

Figures 2A, 2B:
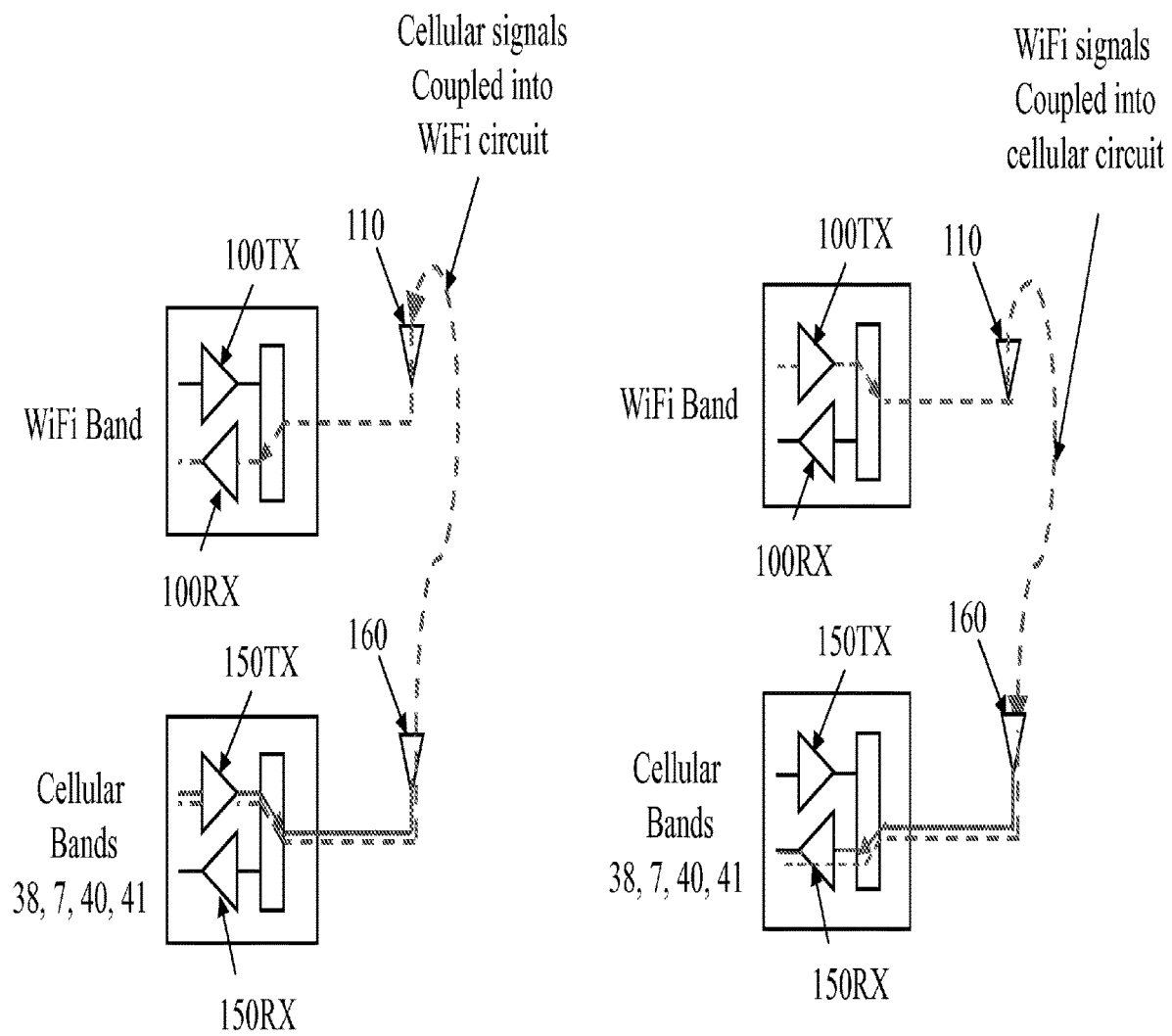

FIGS. 2A and 2B illustrate interferences between the WiFi band and the cellular bands in the 2.0-2.7 GHz range (shown in Figure IA) on a conventional wireless device.

Figure 3A:
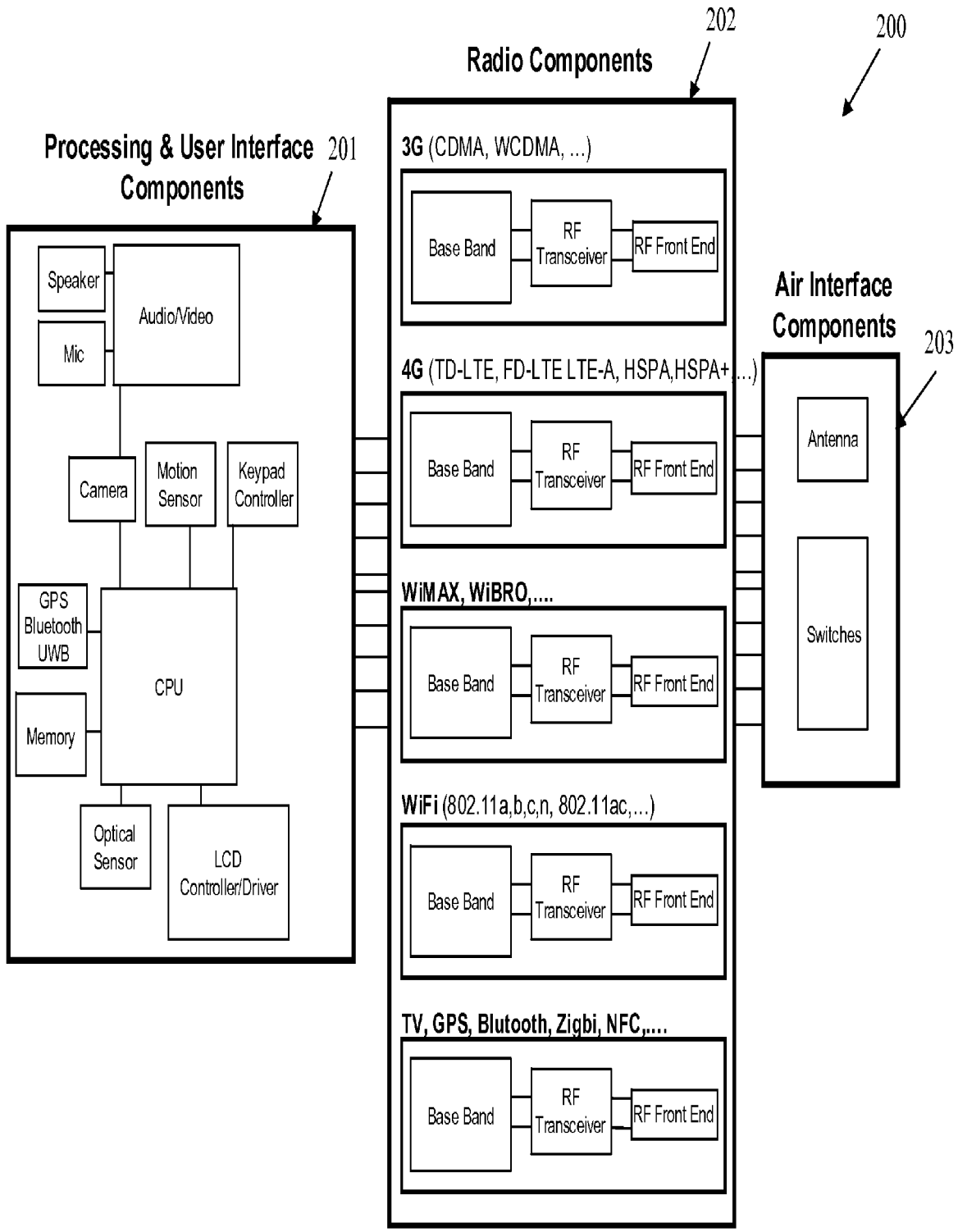

FIG. 3A is a system diagram of a multimode multiband wireless device.

Figure 3B:
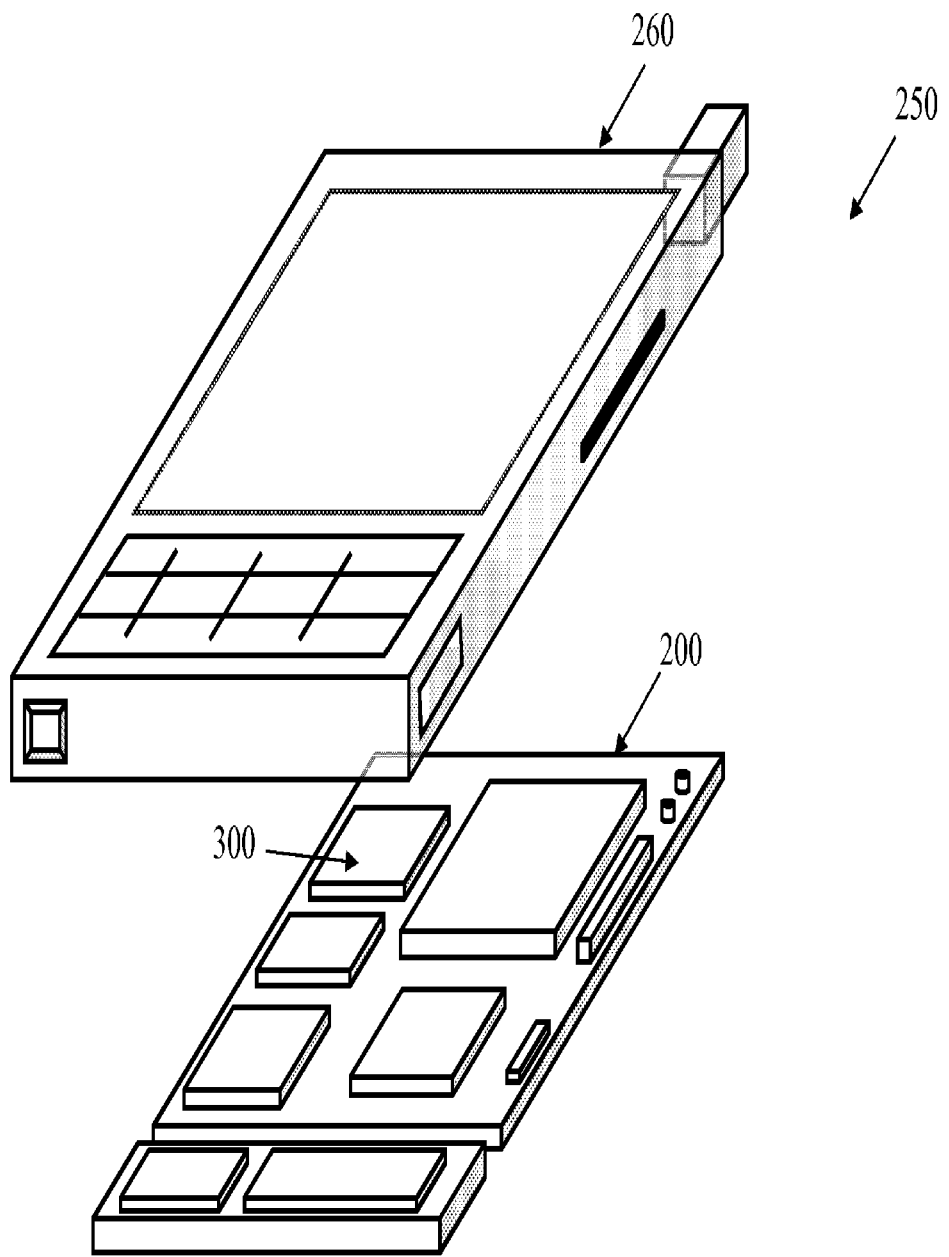

FIG. 3B is a schematic diagram of the multimode multiband wireless device in FIG. 3A.

Figure 3C:
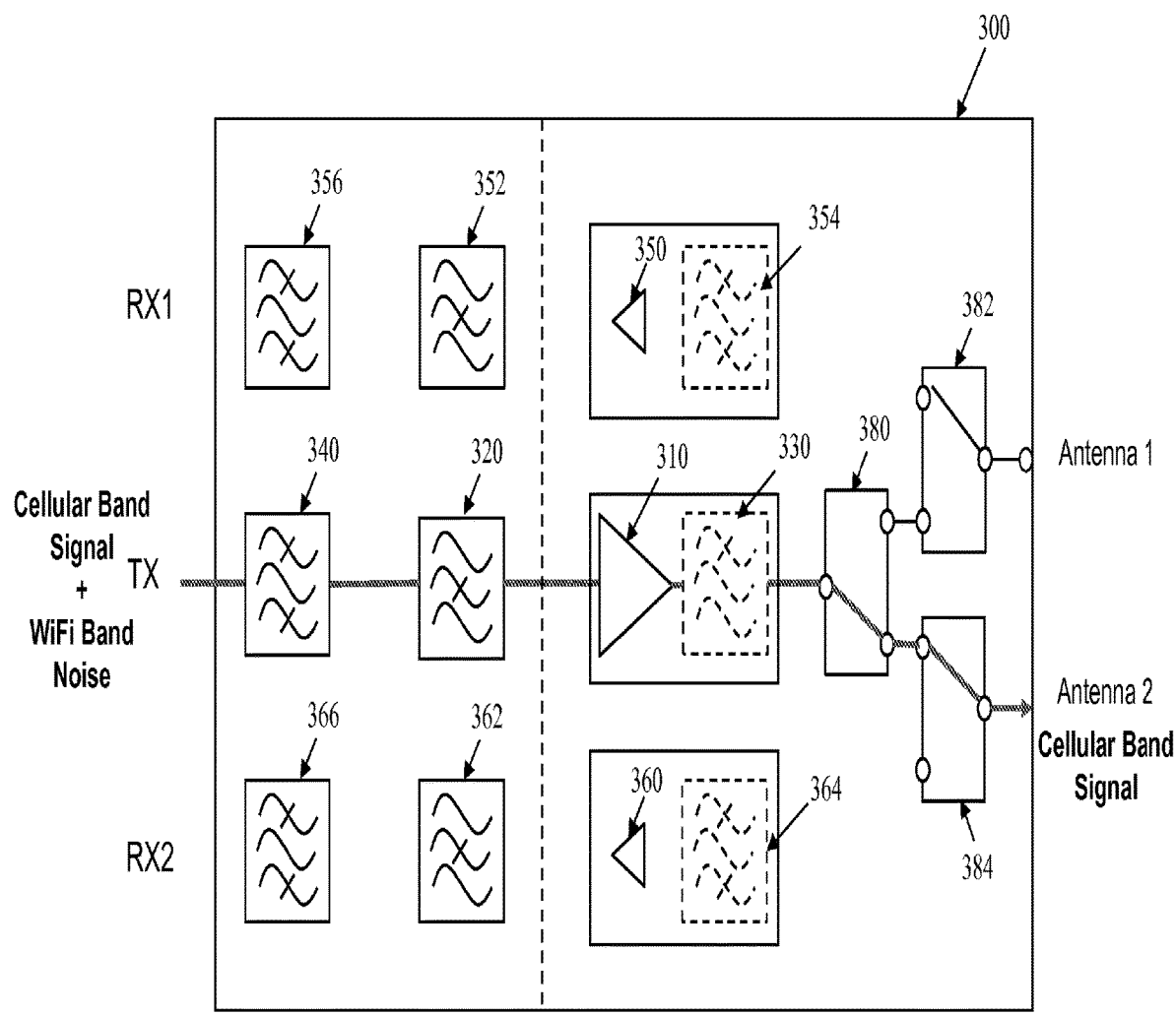

FIG. 3C shows the transmission of RF signals in by the RF amplifier circuit in a wireless device in accordance with the present invention.

Figure 3D:
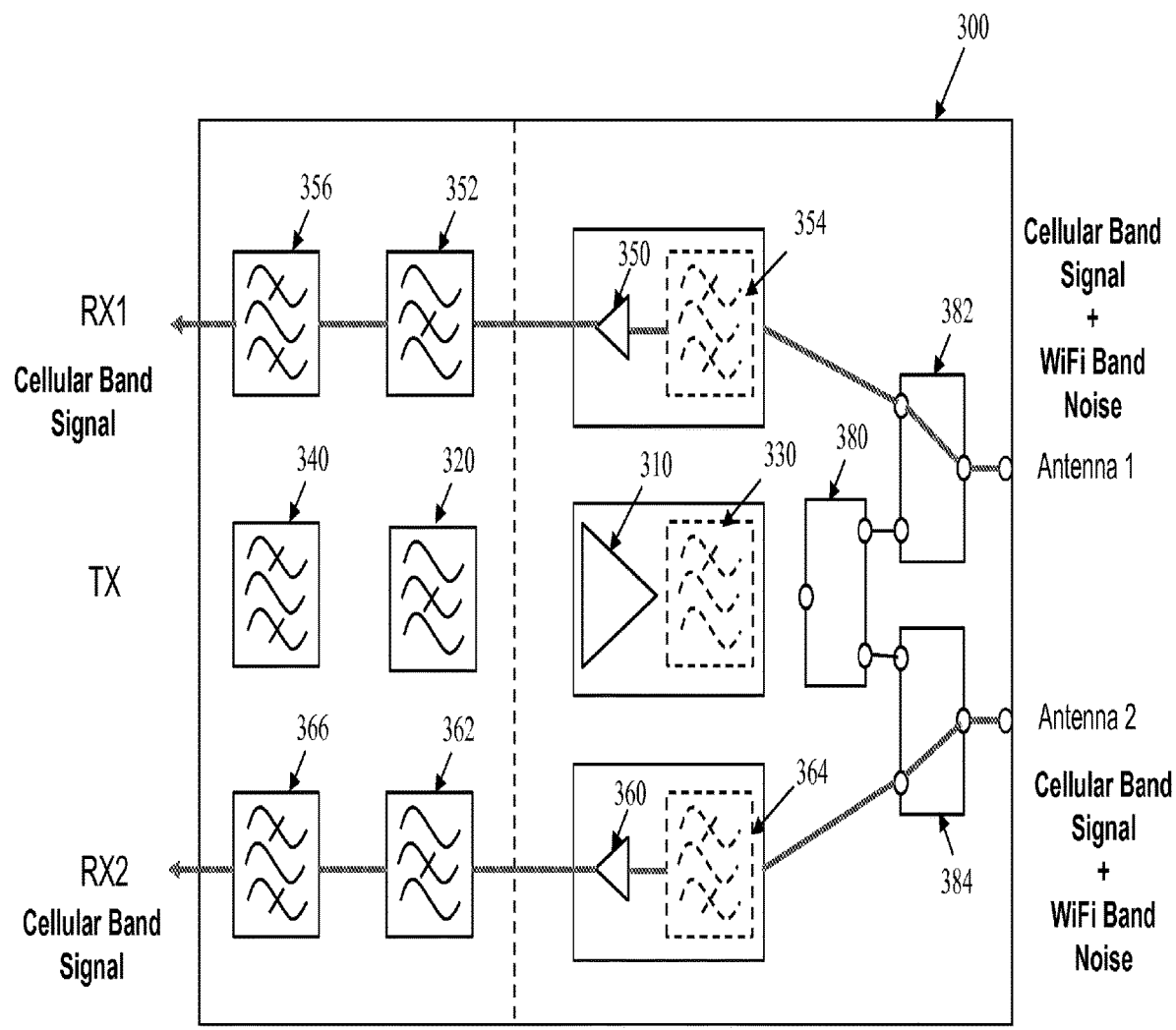

FIG. 3D shows the reception of RF signals in a wireless device circuit in accordance with the present invention.

Figures 4A, 4B, 4C:
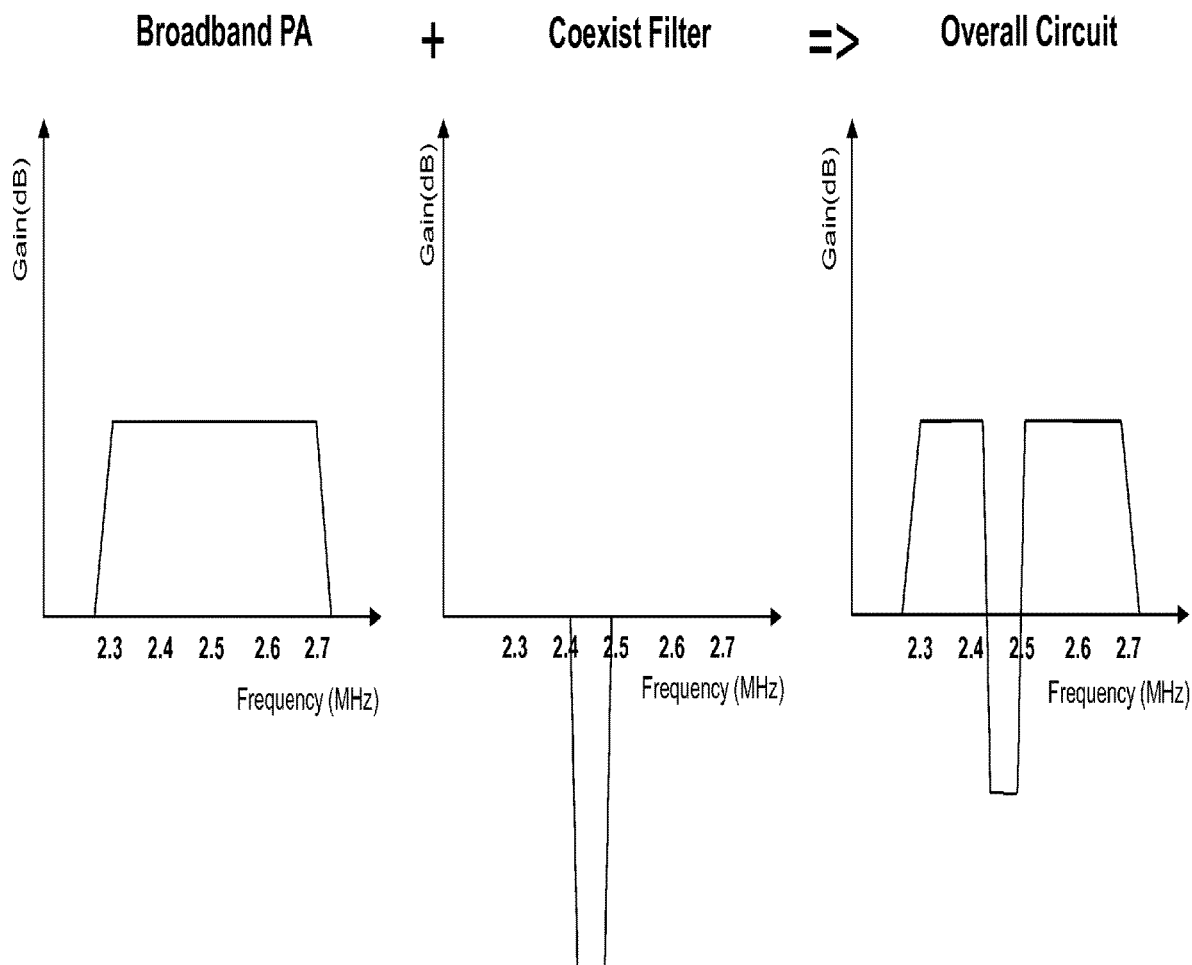

FIG. 4A shows an exemplified broadband PA gain profile of the transmission (TX) path in the amplifier circuit in FIG. 3C.

FIG. 4B shows the attenuation profile of the coexist filter in FIG. 3C.

FIG. 4C shows the overall gain profile of the transmission (TX) path in FIG. 3C.

Figure 5A:
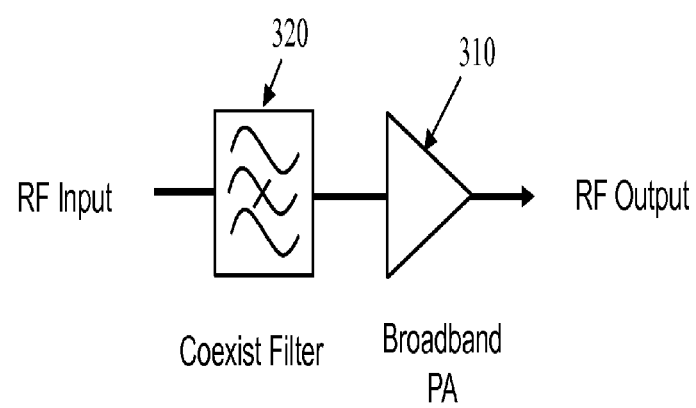

FIG. 5A shows a portion of the RF amplifier circuit having a notch type coexist filter in FIG. 3C.

Figure 5B:
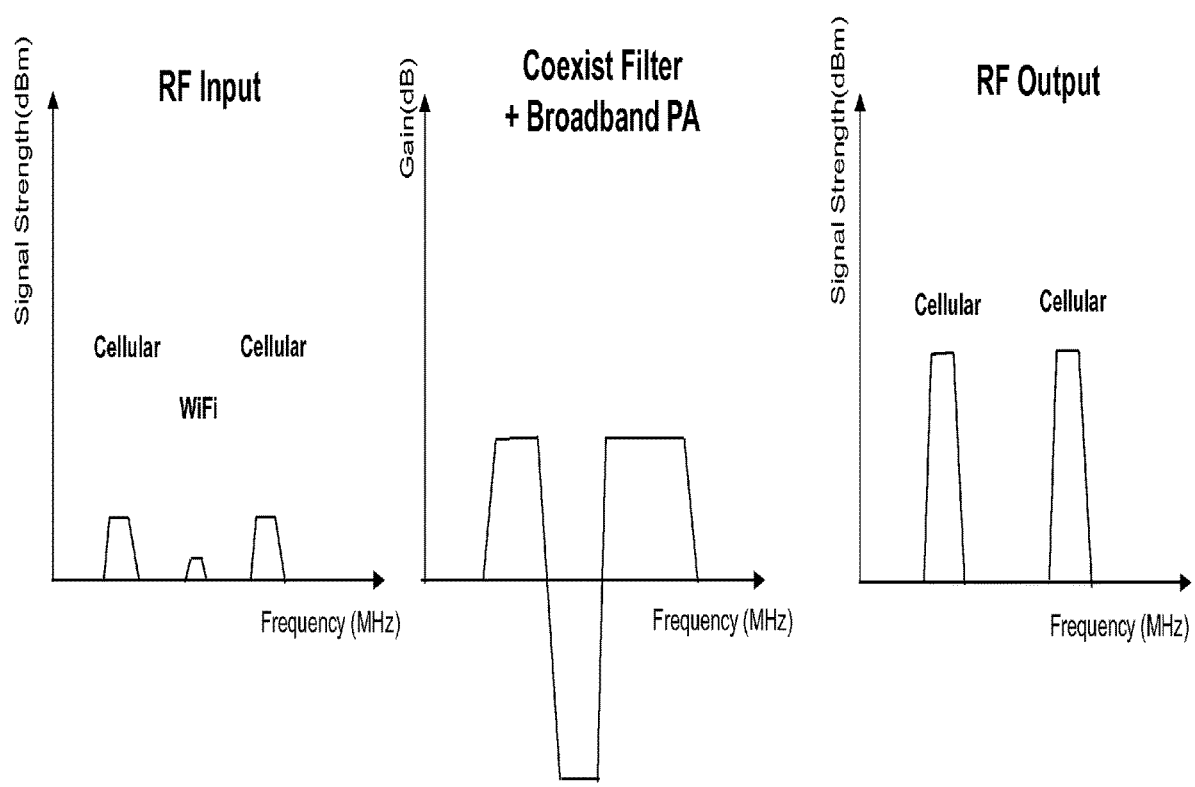

FIG. 5B illustrates the coexist-filter attenuation profile and broadband PA profile of the broadband RF amplifier in Figure SA.

Figure 5C:
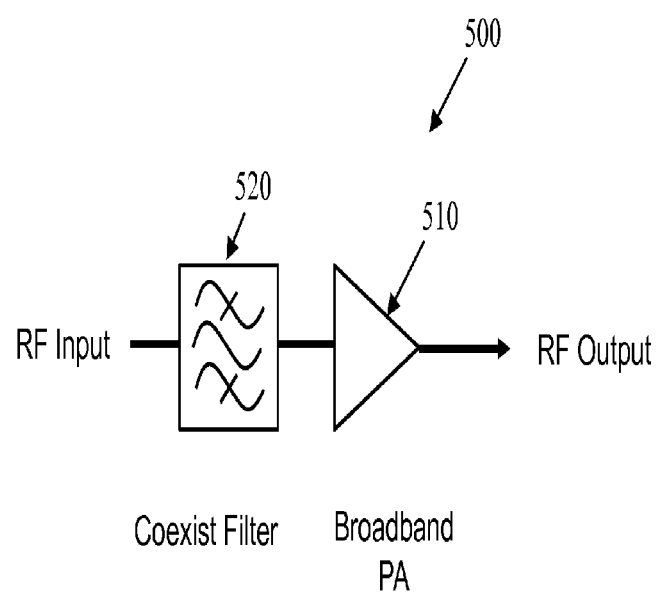

FIG. 5C shows a portion of the RF amplifier circuit having a band-pass type coexist filter.

Figure 5D:
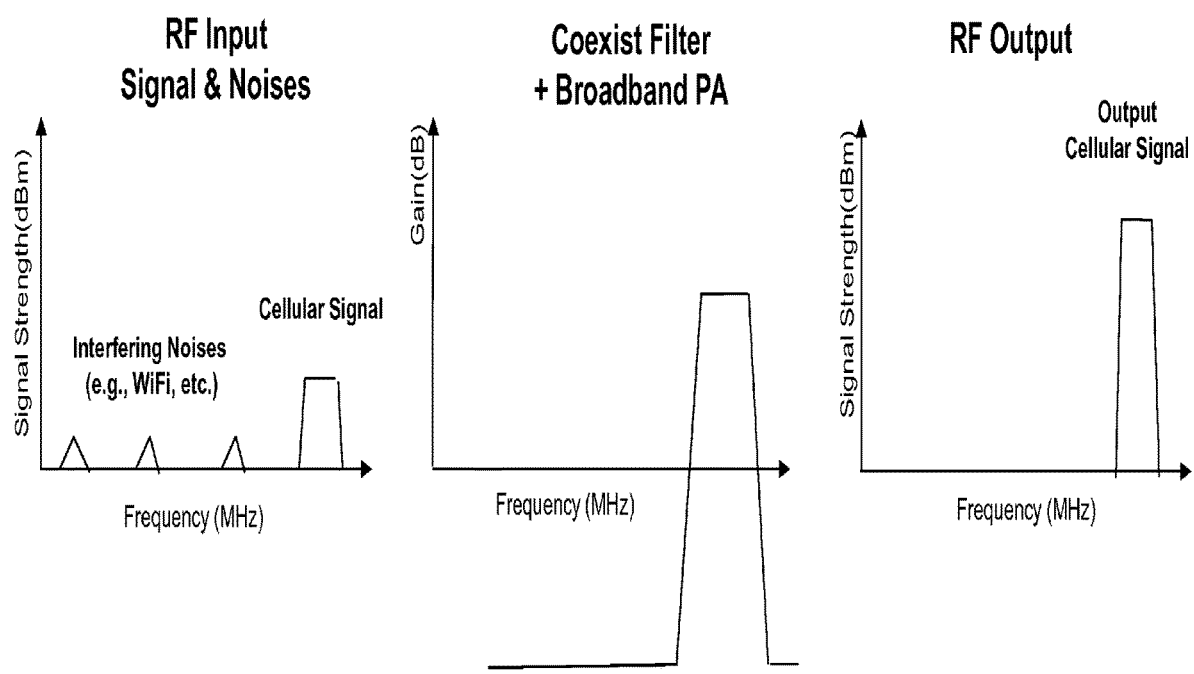

FIG. 5D illustrates the band-pass type coexist-filter profile and broadband PA profile of the broadband RF amplifier in FIG. 5C.

Figure 6:
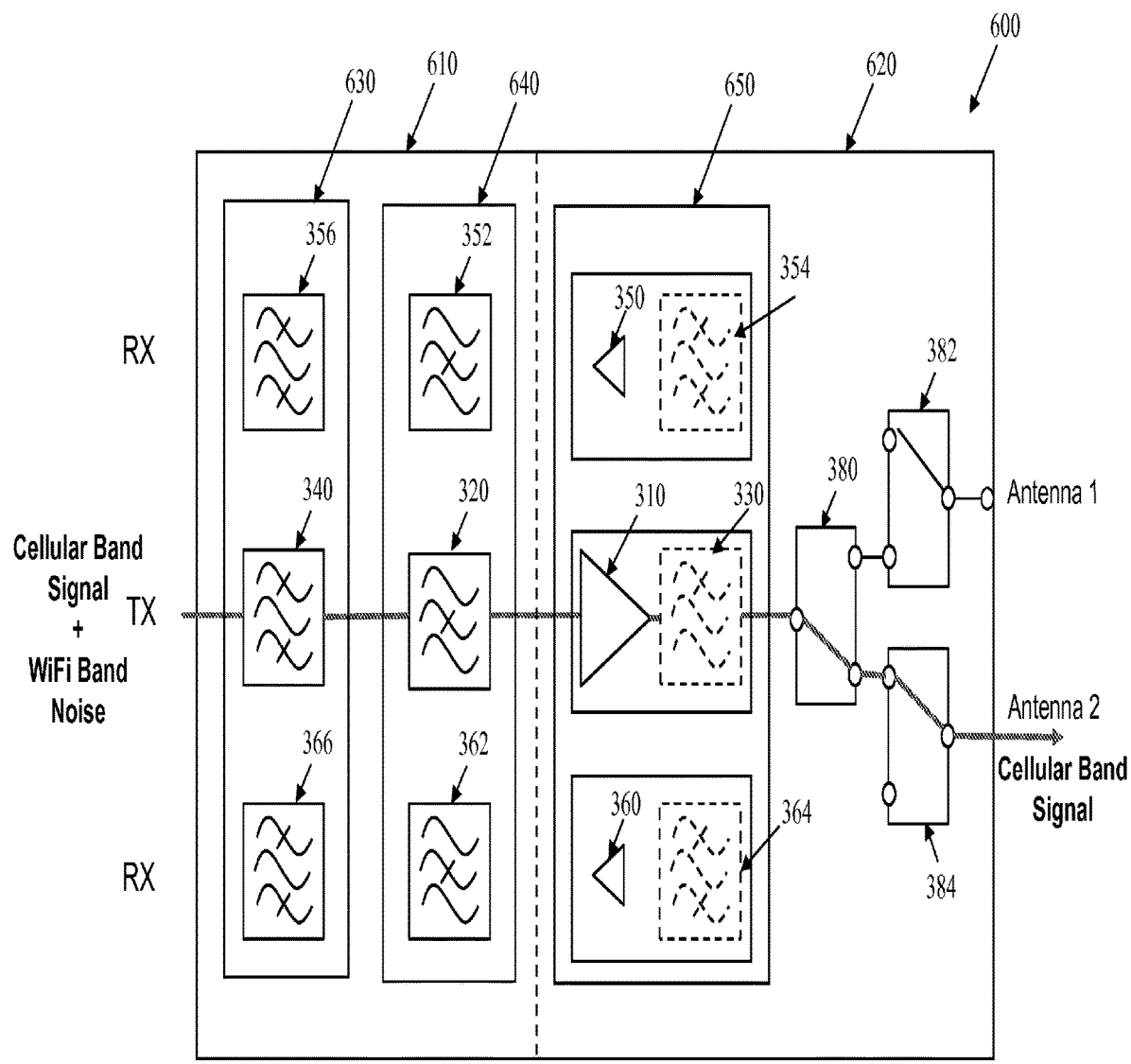

FIG. 6 shows an implementation of an RF amplifier circuit on multiple dies in accordance with the present invention.

Figure 7:
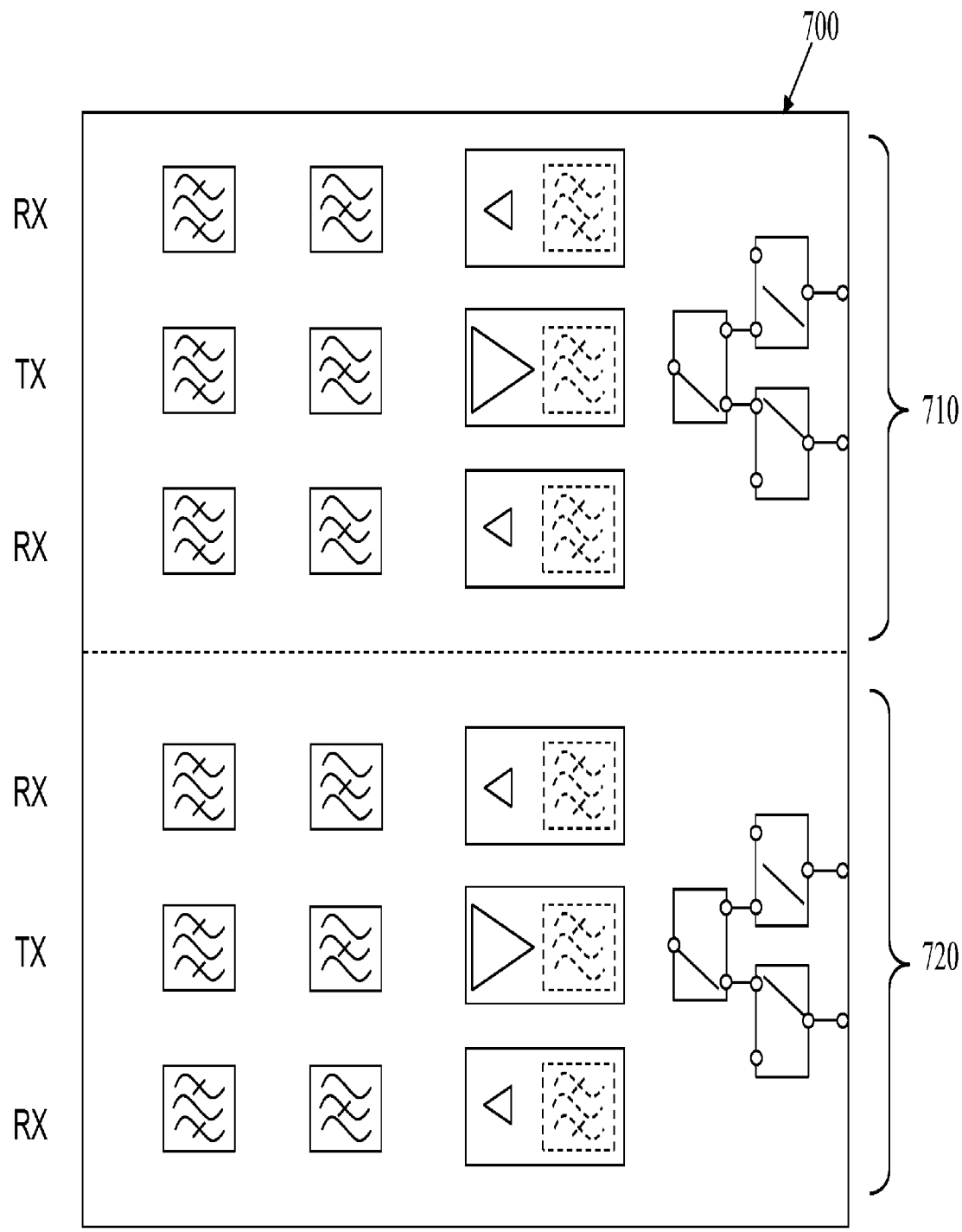

FIG. 7 shows multiple RF amplifier circuits aggregated on a single substrate in accordance with the present invention.

Figure 8A:
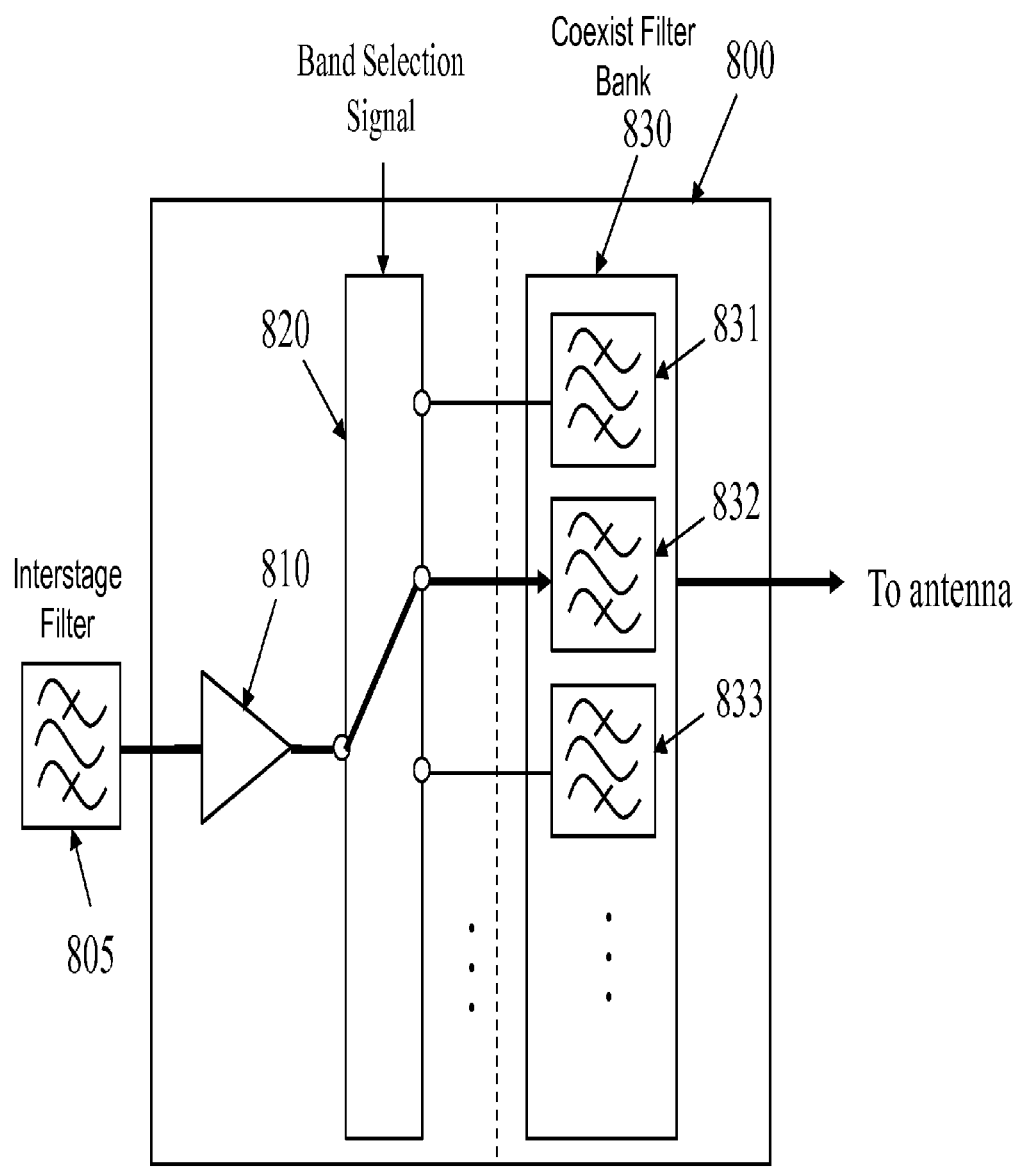

FIG. 8A shows the transmission of wireless signals in an RF power amplifier circuit based on multiplexing coexist filters in accordance with the present invention.

Figure 8B:
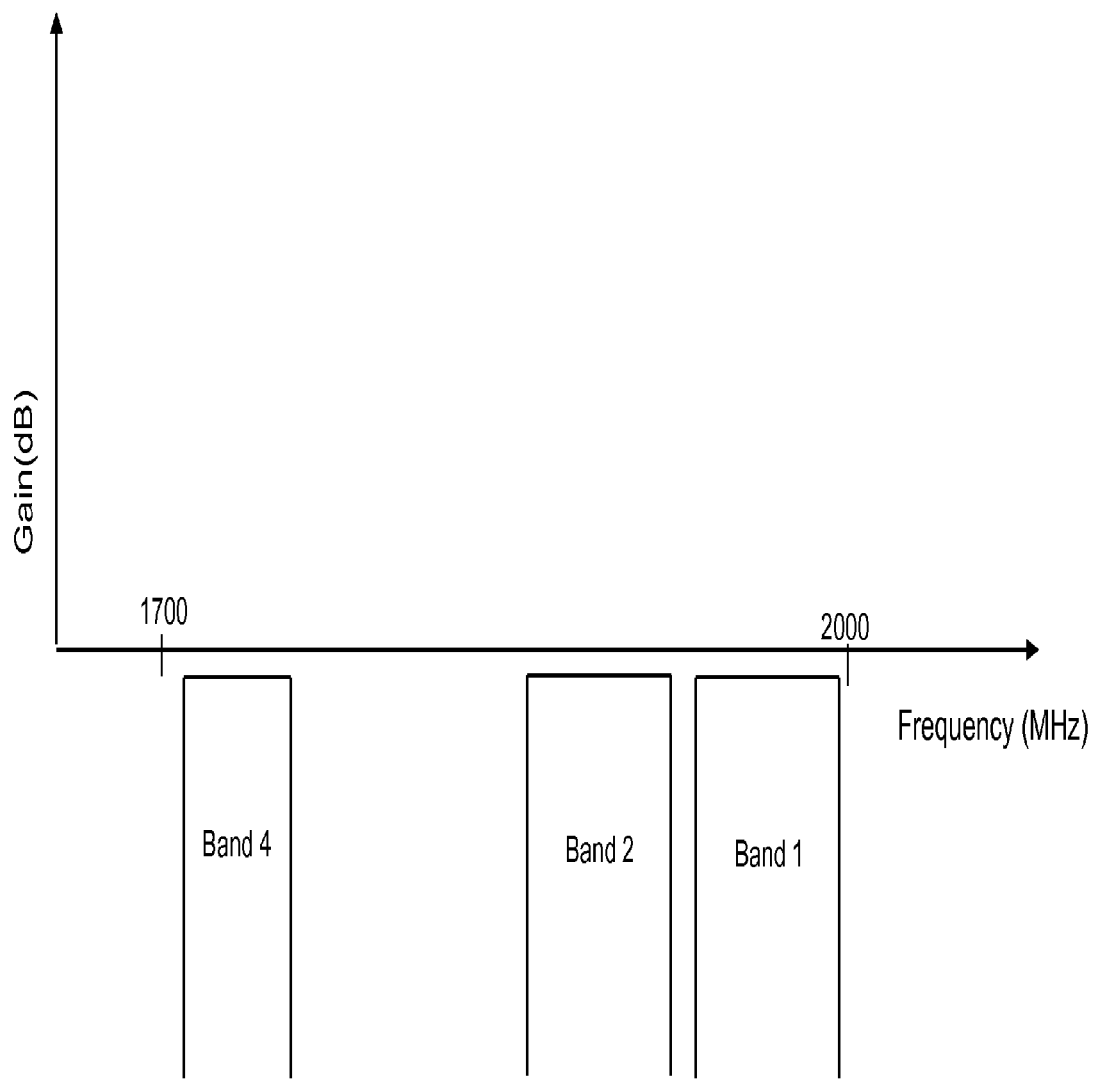

FIG. 8B shows exemplified attenuation profiles of the coexist filters in the RF power amplifier circuit shown in FIG. 8A.

Figure 8C:
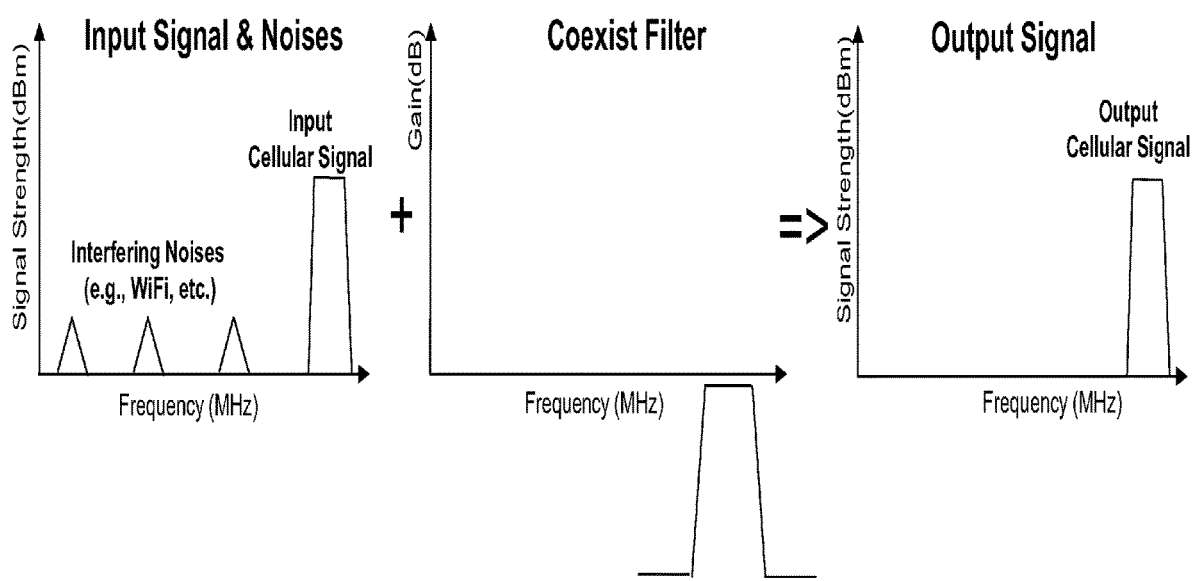

FIG. 8C illustrates the amplifier output signal and the band pass profile of the RF amplifier circuit in FIG. 8A.

Figure 9A:
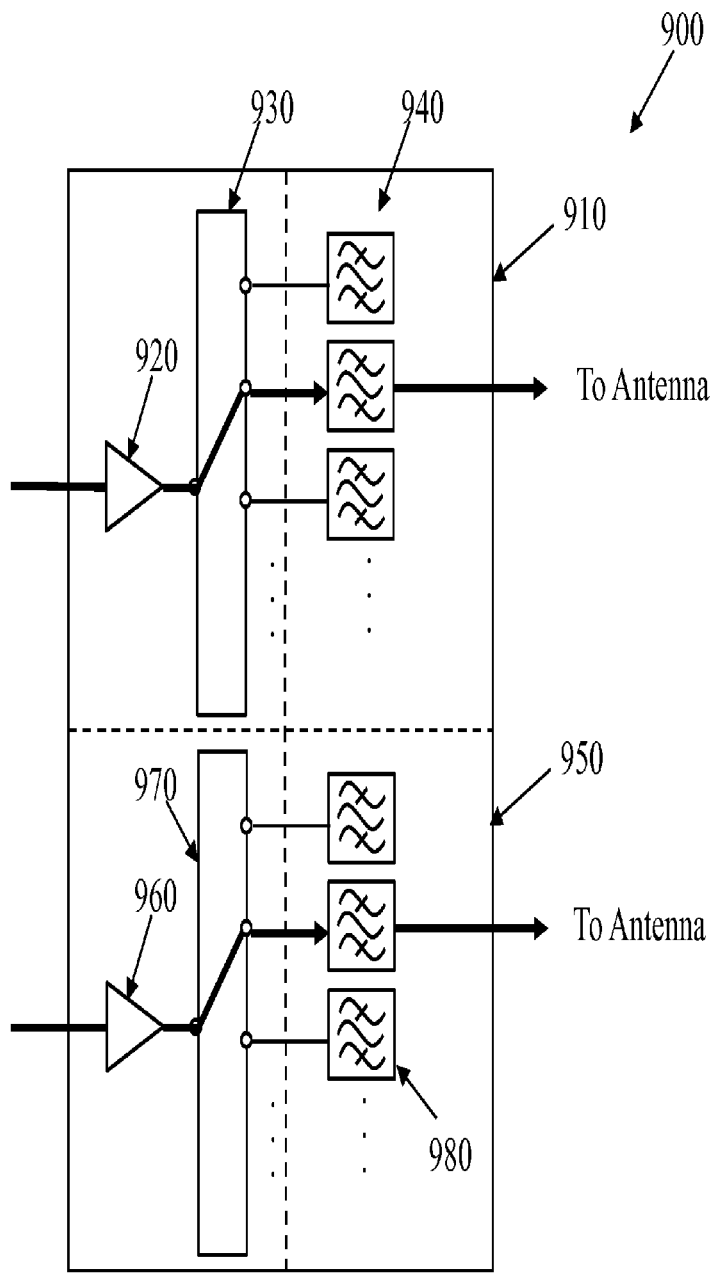

FIG. 9A shows multiple RF power amplifier circuits based on multiplexing coexist filters in a single device in accordance with the present invention.

Figure 9B:
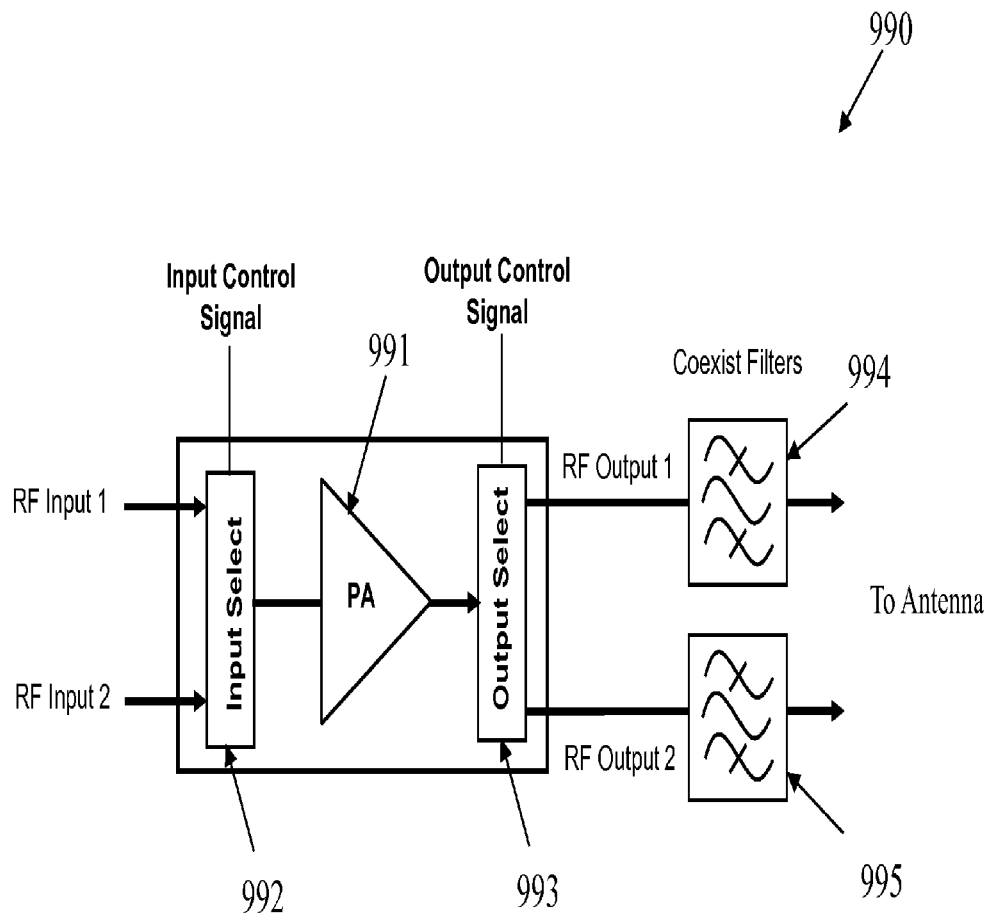

FIG. 9B shows a RF power amplifier circuit including selectable multiple RF input ports and selectable multiple RF output ports and multiple coexist filters in accordance with the present invention.

Figure 10A:
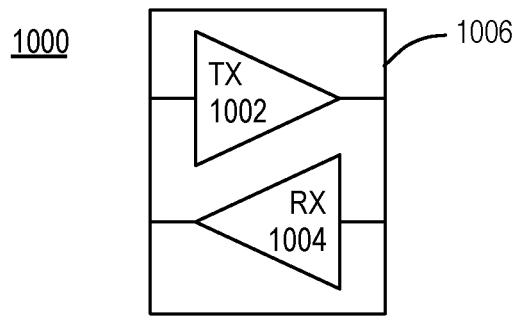

FIG. 10A illustrates a functional block diagram of a millimeter wave (mmWave) module 1000 with integrated power amplifiers 1002 and 1004 which can be used in a radio frequency front end system (RFFE) of a multimode multiband wireless device 250.

Figure 10B:
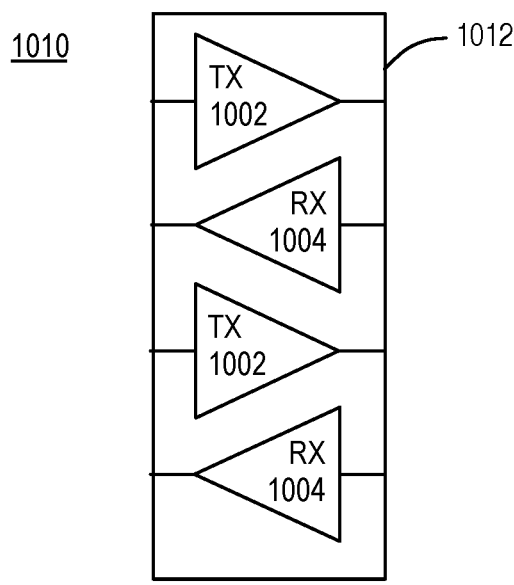

FIG. 10B illustrates a functional block diagram of another embodiment of a mmWave module 1010 which has semiconductor substrate 1012 with at least two power amplifiers 1002 and two low noise amplifiers 1004.

Figure 11:
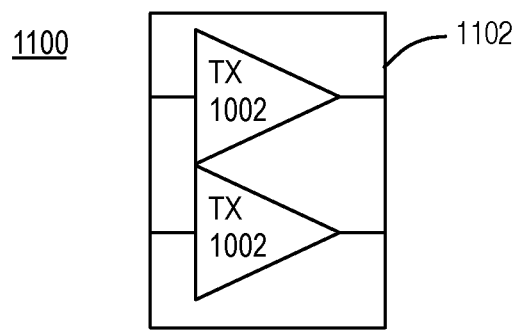

FIG. 11 illustrates a functional block diagram of another embodiment of a mmWave module 1100 on a semiconductor substrate 1102 with multiple integrated power amplifiers 1002.

Figure 12:
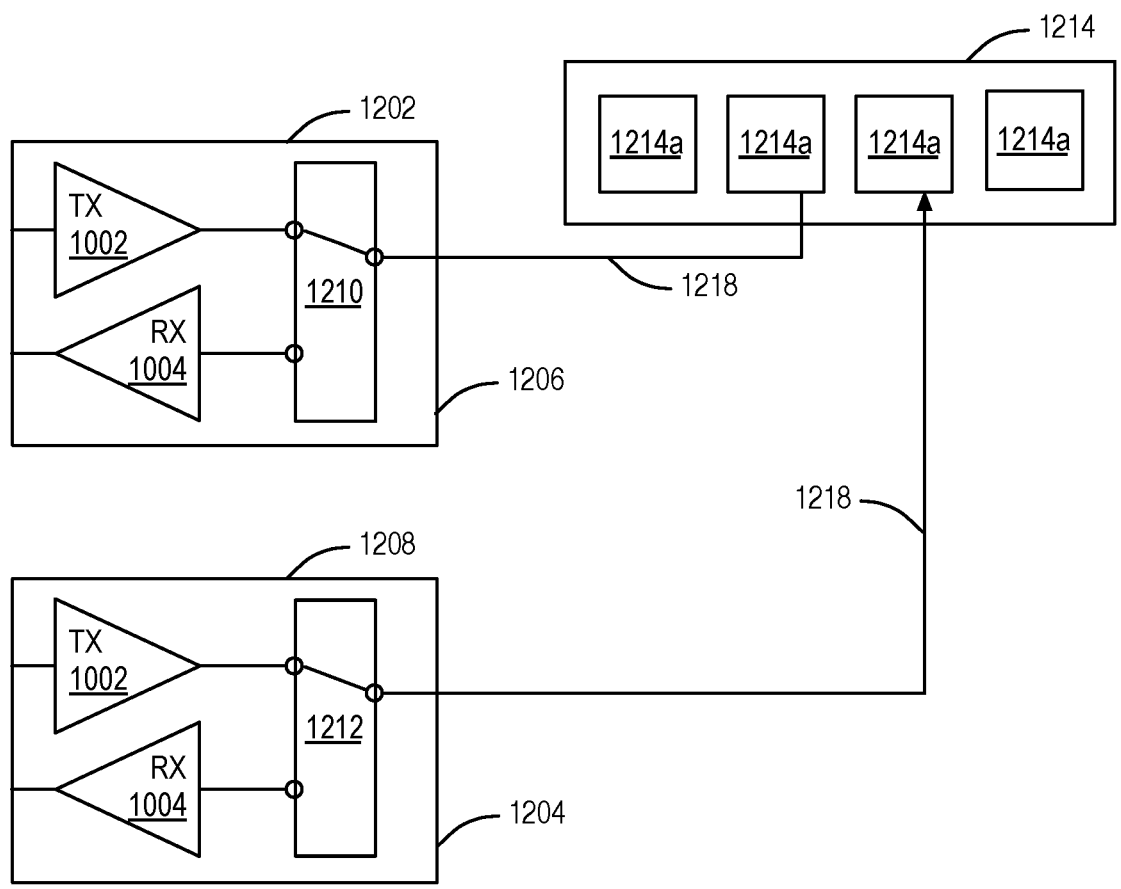

FIG. 12 shows a functional block diagram of mmWave modules 1202 and 1204 having semiconductor substrates 1206 and 1208 with integrated amplifiers 1002 and 1004 which can be used in a multimode multiband wireless device 250 described above to send and receive mmWave signals.

Figure 13:
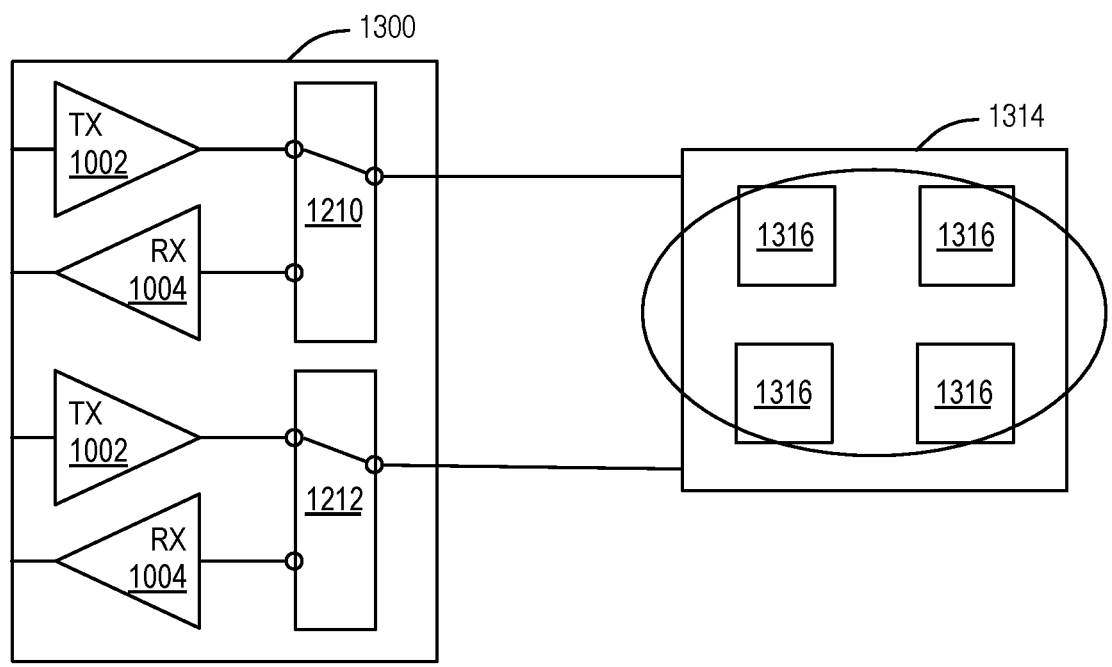

In FIG. 13 shows a functional block diagram of a mmWave module 1300 which is connected to a two dimensional antenna array 1314.

Figure 14A:
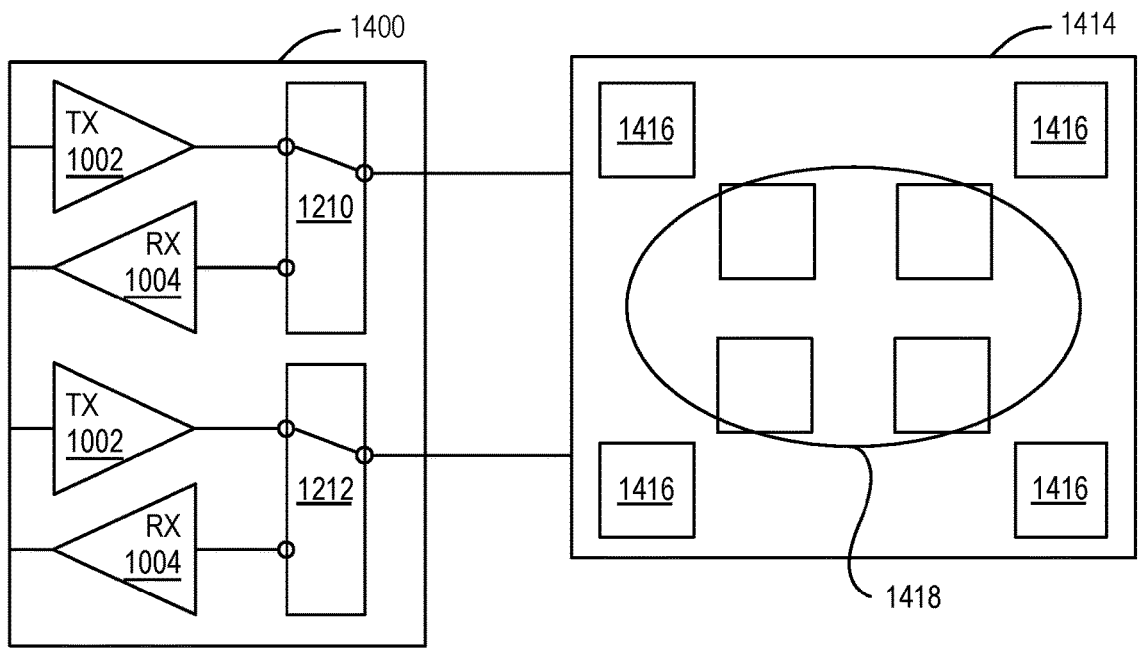
Figure 14B:
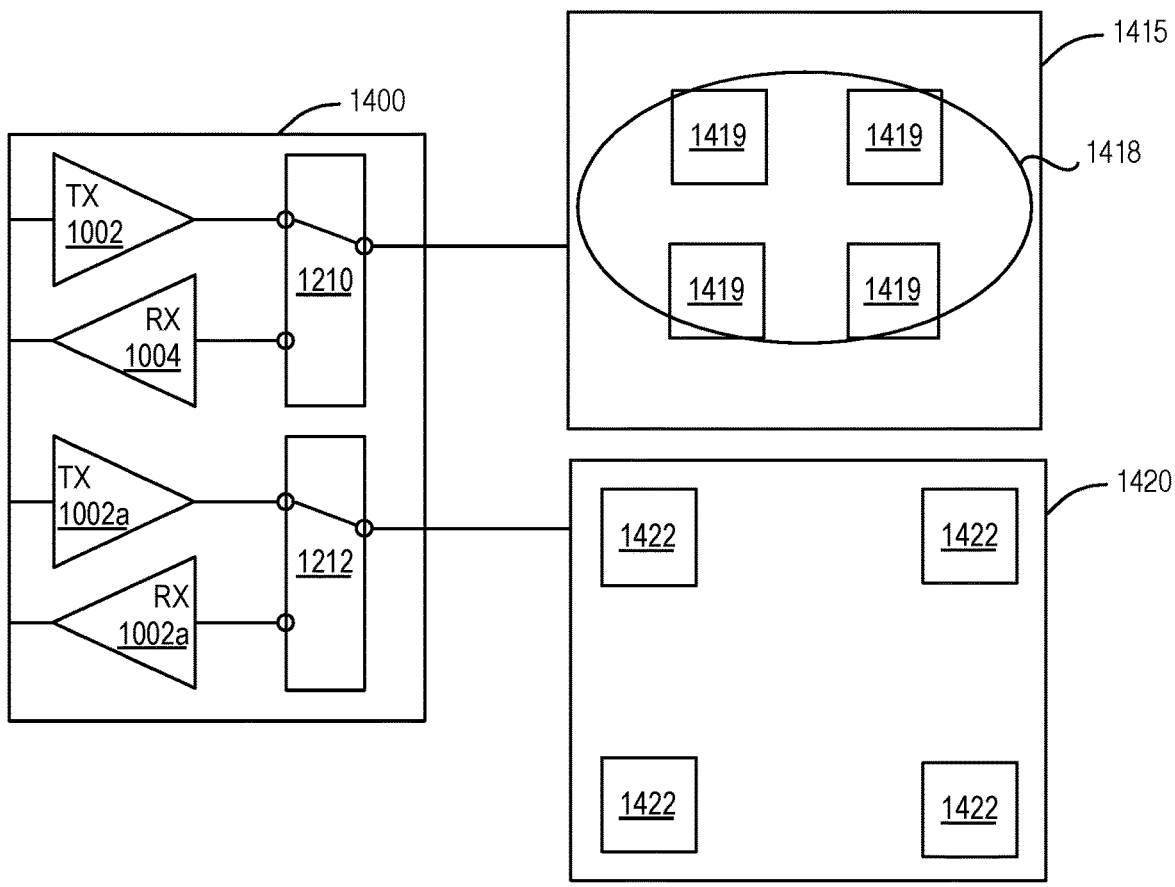

FIGS. 14A and 14B illustrate a functional block diagram a mmWave module 1400 with multiple integrated power amplifiers and LNAs connected to a two dimensional antenna array with two sets of two dimensional antenna array configurations and one dimensional arrays.

Figure 15A:
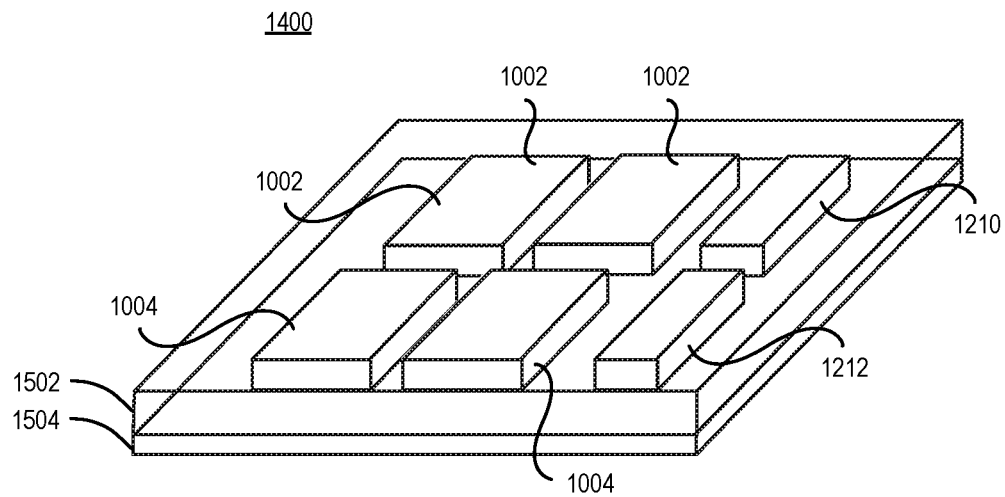
Figure 15B:
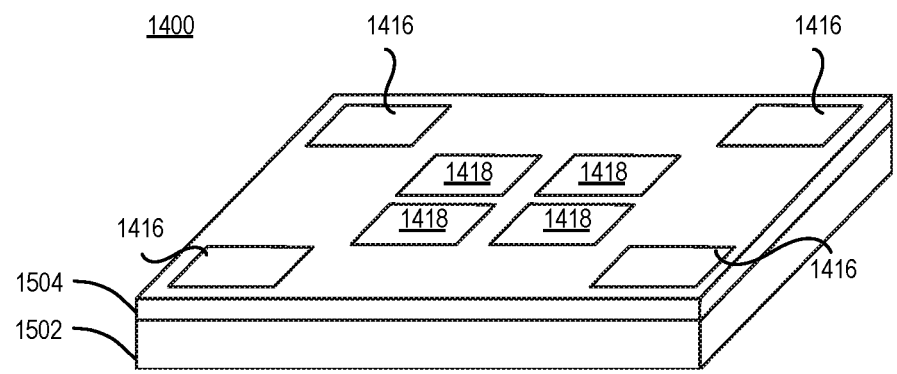

FIG. 15A shows a top perspective view of the arrangement of the elements in multichip module 1400 forming a top layer 1502 and the antenna array elements forming a bottom layer 1504. FIG. 15B shows bottom layer 1504 with first antenna array elements 1416 and second antenna array elements 1418.

Figure 16:
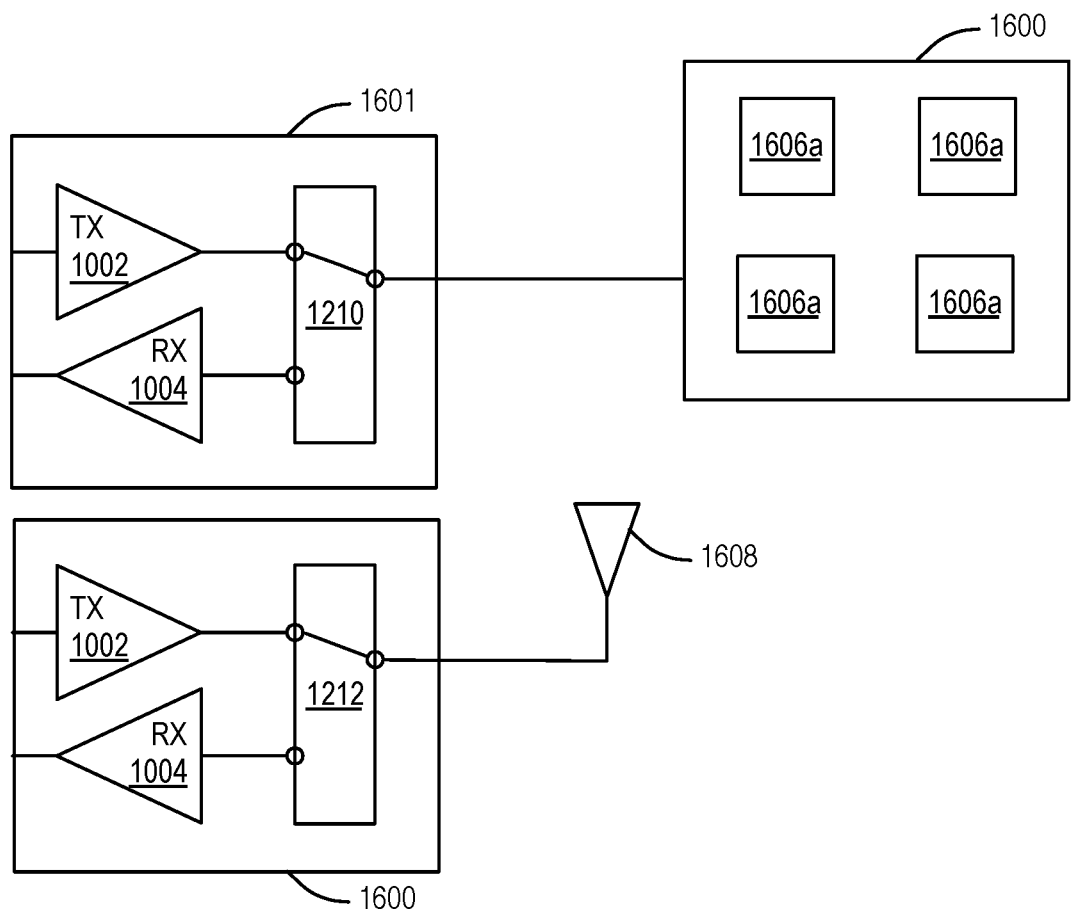

FIG. 16 illustrates a functional block diagram showing mmWave module 1600 operating in a manner similar to the embodiment shown in FIG. 14 however in this embodiment integrated amplifier 1002 and LNA 1004 operate in millimeter wave frequencies and integrated amplifier 1602 and LNA 1604 operate in microwave frequencies.

Figure 17A:
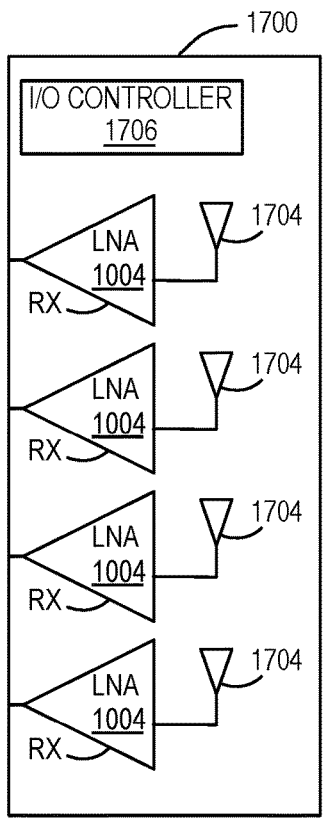
Figure 17B:
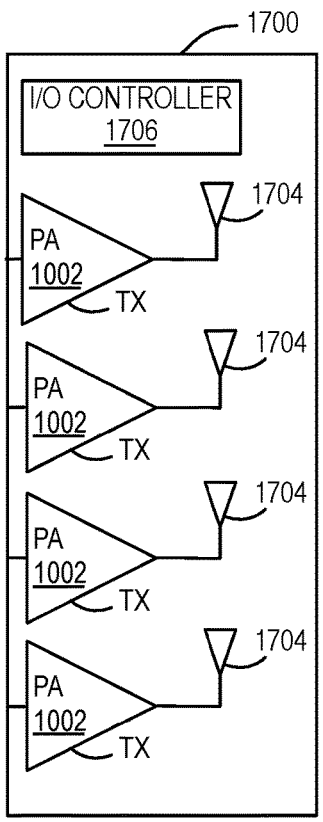
Figure 17C:
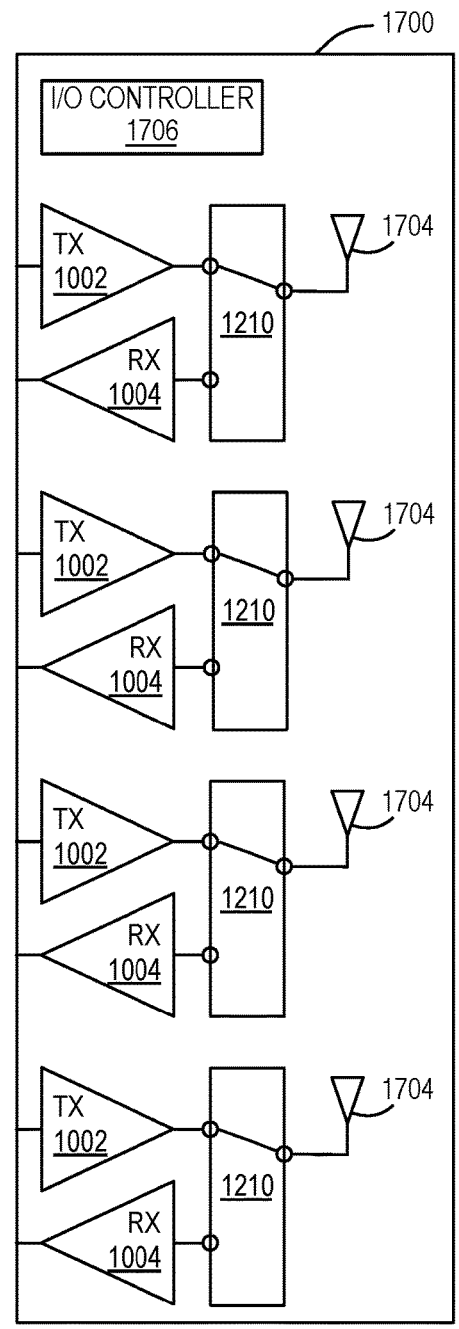

FIGS. 17A-17C illustrates a functional block diagram of a mmWave module 1700 with either multiple integrated LNAs 1004 (FIG. 17A), multiple integrated power amplifiers 1002 (FIG. 17B), or both (FIG. 17C) with corresponding antennas 1704.

Figure 17D:
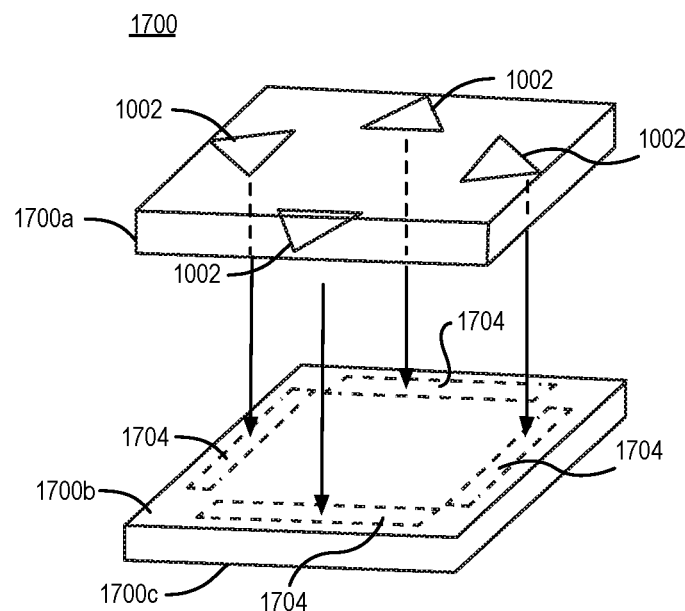

FIG. 17D shows a perspective view of module 1700 and which has a top layer of approximately the same size as the bottom layer and antennas mounted on the bottom face of the bottom layer. In FIG. 17D power amplifiers 1002 are shown in the top layer 1700a but this could also be just LNAs 1004 or both power amplifiers 1002 and LNAs 1004.

Figure 17E:
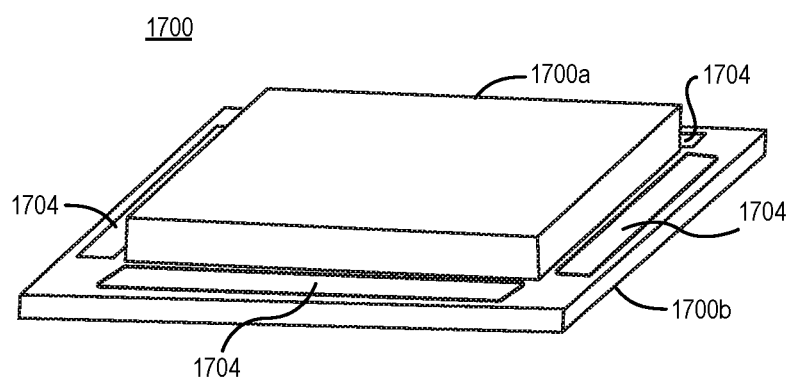

FIG. 17E shows a perspective view of module 1700 and which has a top layer of smaller than the bottom layer to allow the antennas to be exposed.

Figure 18:
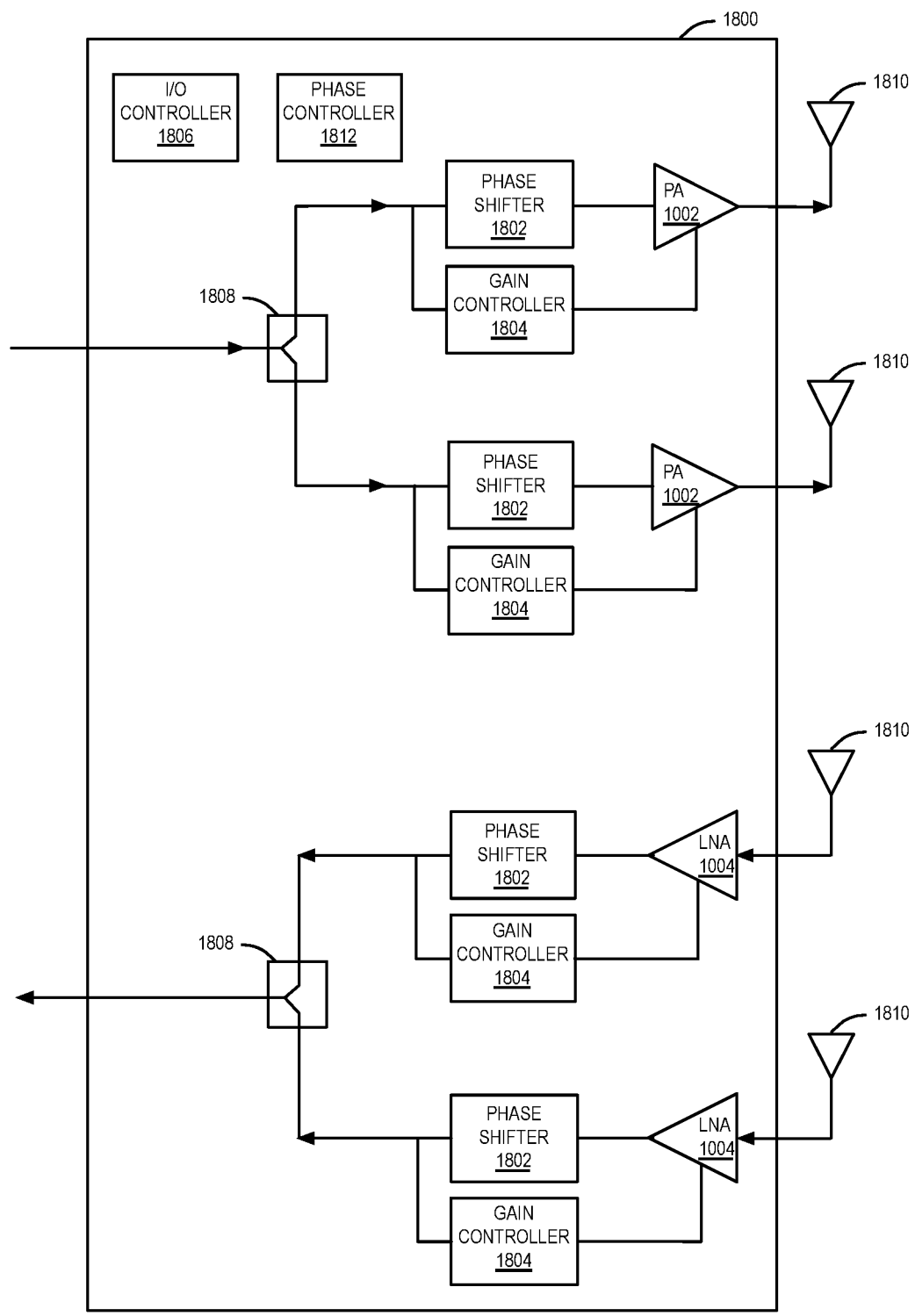

FIG. 18 illustrates a functional block diagram of a plurality of integrated components all located on the same substrate 1800 in the same package.

Figure 19A:
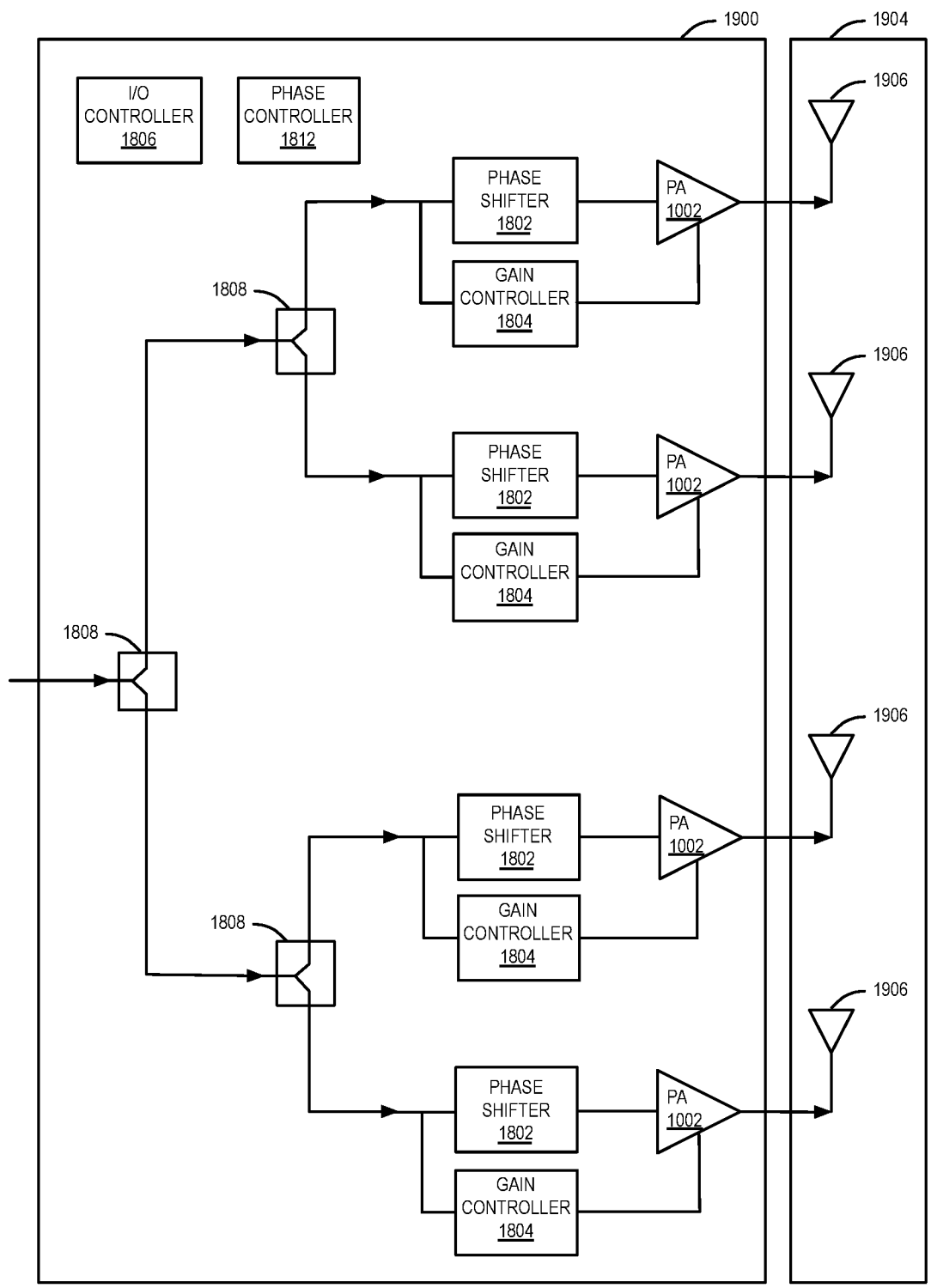
Figure 19B:
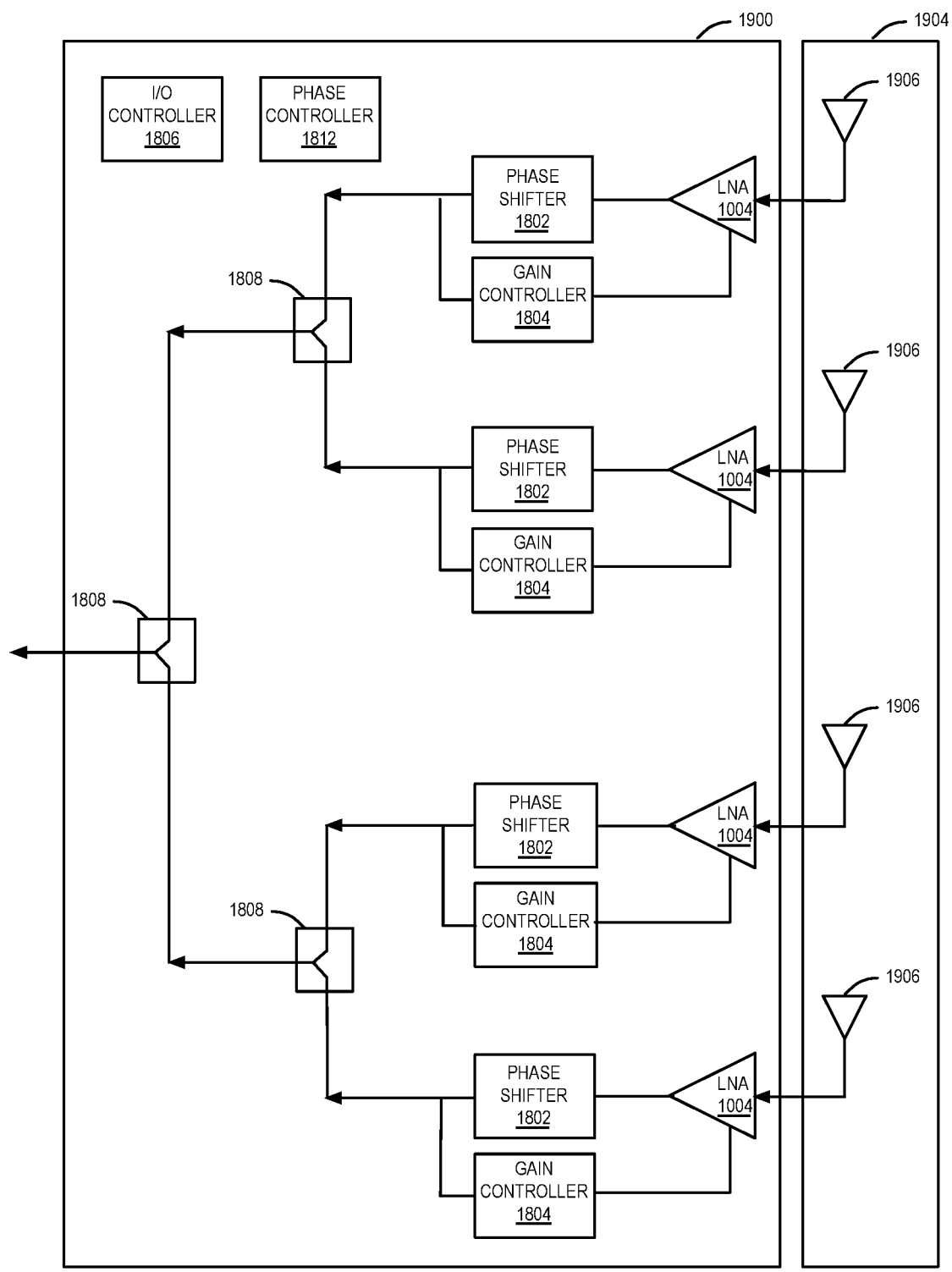

FIGS. 19A and 19B illustrate a functional block diagram of a plurality of integrated components on a substrate 1900 with the antennas located on a different substrate.

Figure 20A:
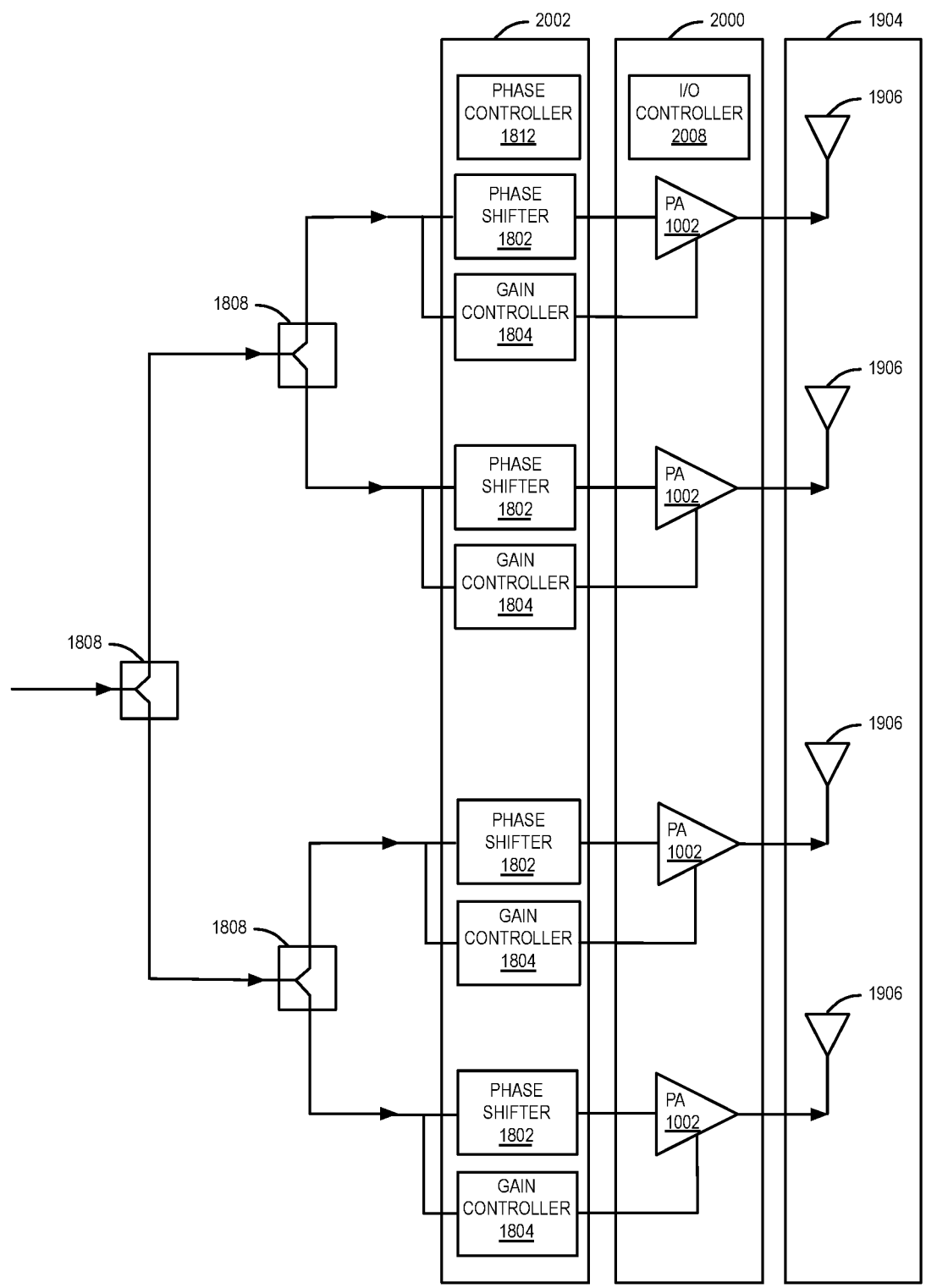
Figure 20B:
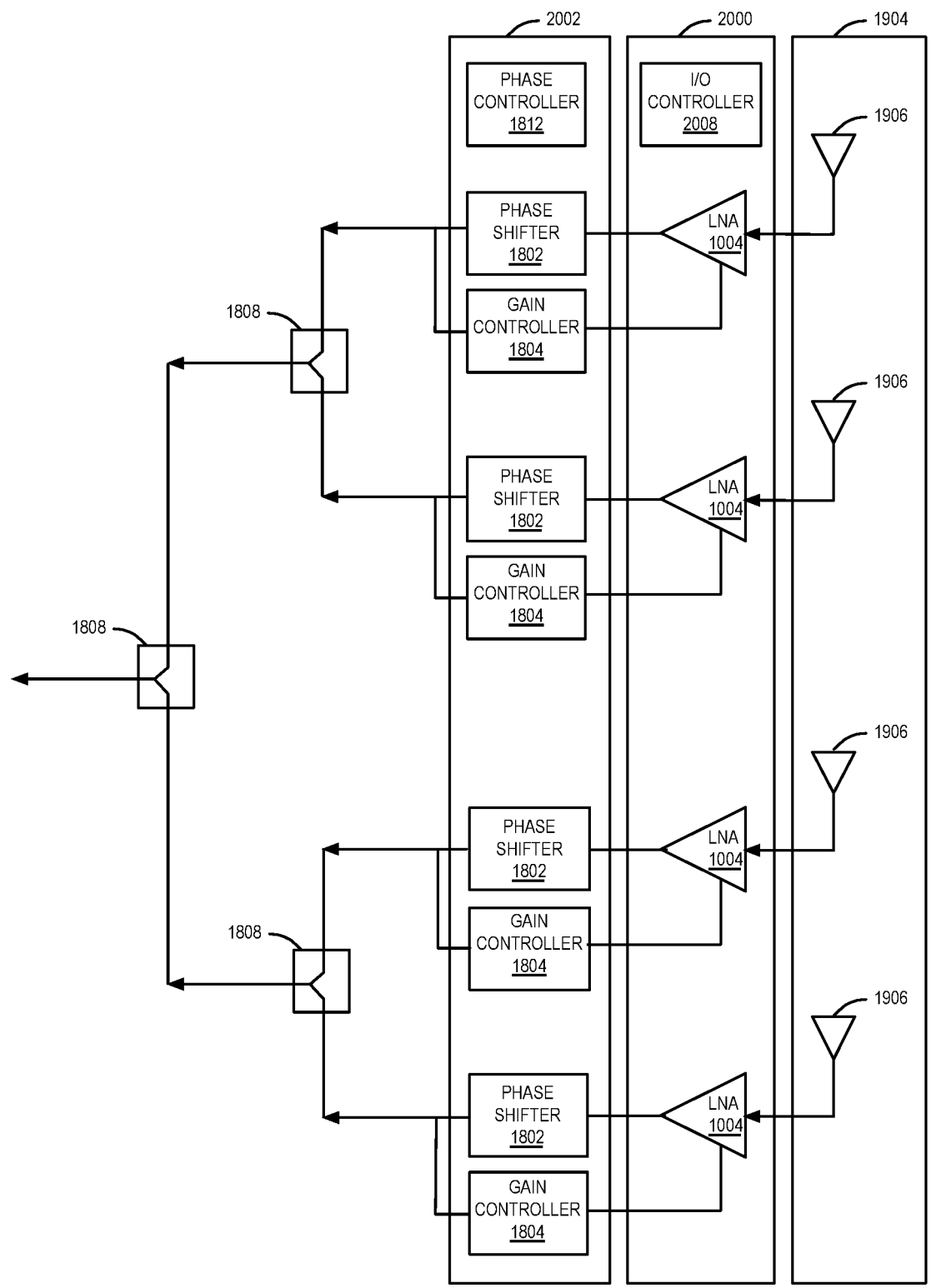

FIGS. 20A and 20B illustrate a functional block diagram with the phase shifters and gain controllers, amplifiers and antennas all located on different substrates.

DETAILED DESCRIPTION OF THE INVENTION

Throughout this disclosure the same reference numerals described with regard to one figure perform the same function when used in other figures.

Referring to FIGS. 3A and 3B, a multimode multiband wireless device 250 includes user interface 260 and multimode RF circuits 200 having receiving and/or transmitting capabilities for cellular phone and wireless services. For example, as shown in FIG. 3A, 3G, 4G, 5G, WiMax, Wi Bro, WiFi, DTV, SDARS, GPS, Bluetooth, Zigbee, millitmeter Wave (mmWave), NFC, FM radio can coexist as radio components 202 in the multimode multiband wireless device 250. The multimode RF circuits 200 can further include processing and user interface components 201 and air interface component 203.

The cellular phone can communicate in multiband frequencies such as defined by FIGS. 1A-1D. In the present disclosure, the term "coexist" refers to cellular and other wireless services that can communicate in multimode multiband and do not interfere with each other in receiving and transmitting.

In the present specification, the term "broadband" refers to an RF frequency band that spans the frequency range of two or more cellular bands. The term "broadband amplifier" refers to an amplifier that can amplify RF signals in a wide frequency range covering multiple cellular bands. Therefore, a wireless device using broadband power amplifier can operate in multiple cellular bands.

Referring to FIGS. 3C and 3D, a multimode multiband wireless device 300 includes a transmission path (TX) and one or more reception paths (RX1, RX2). The transmission path includes a broadband power amplifier (PA) 310, a coexist filter 320, an antenna filer 330, and an interstage filter 340. A first reception path (RX1) includes a broadband amplifier 350 (i.e. low-noise amplifier), a coexist filter 352, an antenna filer 354, and an interstage filter 356. A second reception path (RX2) includes a broadband amplifier 360, a coexist filter 362, an antenna filer 364, and an interstage filter 366. In the RF front end near antennas, switches 380-384 form single input multiple output (SIMO), which are connected to antennas 1, 2, the output of the transmission path (TX), and the inputs of the reception paths (RXI, RX2).

The switches 380-384 can provide time-division duplex for the transmission path and the reception paths. The inter-stage filters 340, 356, 366 can either be balanced or unbalanced. These inter-stage filters can also be implemented with passive components such as inductors and or capacitors. The coexist filters 320, 352, and 362 can be implemented by notch filters or band-pass filters using high Q resonators such as SAW, BAW or FBAR, etc.

Figure 1A:
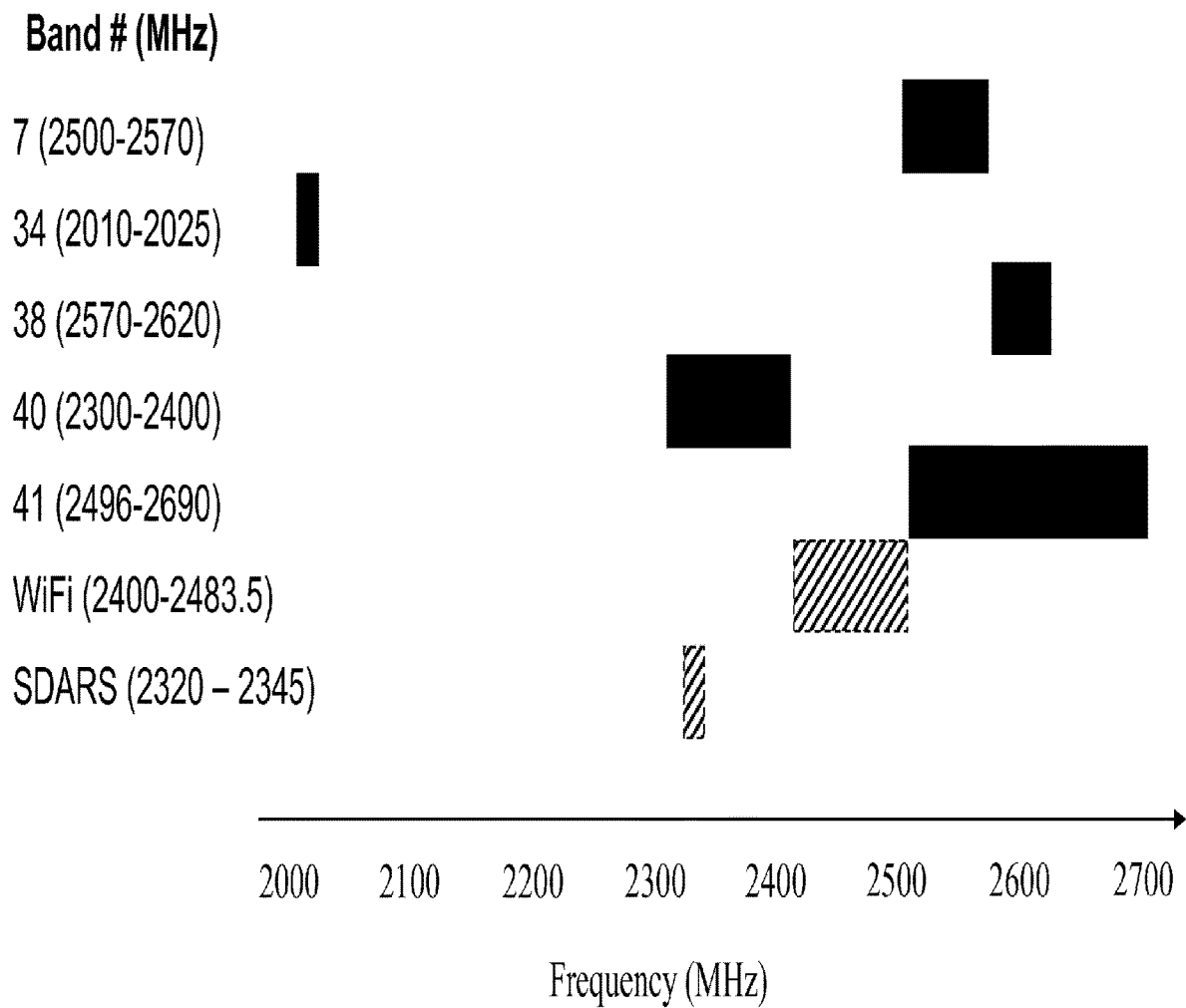
FIG. 1A is a schematic diagram illustrating the WiFi band and cellular bands uplink frequency in the 2.0-2.7 GHz range.

In the transmission mode, the broadband power amplifier (PA) 310 has a broad gain profile spanning from 2.3 GHz to 2.7 GHz, as shown in FIG. 4A, which covers the range of multiple cellular Bands 7, 38, 40, 41, and the WiFi band shown in FIG. 1A. In some implementations, the broadband power amplifier 310 can have a broader gain profile spanning from 2.0 GHz to 2.7 GHz which also covers an additional Band 34. The overall bandwidth and gain profile of the broadband power amplifier 310 is affected by the characteristics of the antenna filer 330, but also the characteristics of the interstage filter 340.

The coexist filter 320, as shown in FIG. 4B, rejects RF noise in the frequency range of 2.4 GHz to 2.5 GHz, in which the WiFi band resides. The coexist filter 320 when implemented by a notch filter has sharp fall offs in the pass at 2.4 GHz and 2.5 GHz. The coexist filter can selectively attenuate noises in the WiFi band, which may be generated by the WiFi circuit or other sources. Referring to FIG. 3C, the interstage filter 340 receives and filters RF signals in a broadband spanning from 2.3 GHz to 2.7 GHz, which can include both cellular band signals and WiFi band noise. The coexist filter 320 filters the RF signal received from the interstage filter 340 and rejects the RF noise between 2.4 GHz and 2.5 GHz. The RF signals filtered by the coexist filter 320 is amplified by output by the broadband power amplifier 310 and further filtered by the antenna filter 330. The resulting amplified transmission RF signals only include cellular signals and are directed by the switches 390-384 to antenna 1, 2 for wireless transmission. The gain profile of the transmission path TX, shown in FIG. 4C, includes two bands with sharp attenuation edges. The coexist filter 320 can be implemented by a notch filter which can attenuate RF signals between 2.4 GHz and 2.5 GHz (i.e. noise in the WiFi band) by several orders of magnitudes.

In the reception path(s) (RX1, RX2), referring to FIG. 3D, reception RF signals received by antenna 1, 2 can include both cellular band signals and WiFi band noise. The reception RF signals are directed by the switches 382 and 384 to the antenna filters 354 and 364. The antenna filters 354, 364 can reject the RF signals outside of 2.3 to 2.7 GHz range to minimize receiver jamming. The broadband amplifiers 350 and 360 respectively amplify the reception RF signals in the broadband to produce amplified reception RF signals. The broadband amplifiers 350, 360 have broad gain profiles spanning from 2.3 GHz to 2.7 GHz (shown in FIG. 4A), which covers the range of multiple cellular Bands 7, 38, 40, 41, and the WiFi band shown in FIG. 1A. In some implementations, the broadband amplifiers 350, 360 can have broader gain profiles spanning from 2.0 GHz to 2.7 GHz which also covers additional Band 34. The coexist filters 352, 362 subsequently filter out the WiFi band noise in the range from 2.4 GHz to 2.5 GHz in the amplified reception RF signals. The filtered and amplified reception RF signals are further filtered by the interstage filters 356, 366.

The coexist filters 320, 352, 362 can effectively eliminate extraneous RF noise in the WiFi band before the noises get transmitted or received, which enables high quality cellular (e.g. 5G, 4G and 3G) transmissions in coexistence with WiFi communications on the same mobile device.

FIG. 5A shows a portion of the multimode multiband wireless device 300 in FIG. 3C, which includes a broadband power amplifier 310 and a notch type coexist filter 320. The coexist-filter attenuation profile and broadband PA profile of the broadband amplifier are illustrated in FIG. 5B. FIG. 5B illustrates, on the left side, intended input signals in two cellular bands, and interfering noise from a WiFi band between the two cellular bands. The coexist filter 320 is implemented as notch type which has an attenuation profile, shown in the middle, that rejects the noise in WiFi band. The resulting output profile on the right side span only the two intended cellular bands.

FIG. 5C shows a portion of the broadband amplifier circuit 500 having a broadband power amplifier 510 and a band-pass type coexist filter 520. The band-pass type coexist-filter profile and broadband PA profile of the RF amplifier circuit 500 are shown in FIG. 5D. FIG. 5D illustrates on the left side an input signal in an intended cellular band, and interfering noises from WiFi, GPS, DTV, digital TV, digital video broadcasting, or FM radio band adjacent to the cellular band. The coexist filter 320 is implemented as band-pass type which has an attenuation profile, shown in the middle, that rejects the noise in WiFi, GPS, SDARS, Bluetooth, DTV, TV or radio band, which results in an output profile (on the right side) only in the intended cellular band.

In some embodiments, the multimode multiband wireless device 300 including the inter-stage filters 340, 356, 366, the coexist filters 320, 352, 362, the broadband power amplifier 310, the broadband amplifiers 350, 360, the antenna filters 330, 354, 364, and the switches 380-384 can be implemented on a multi-chip package to achieve compact size and to reduce costs.

In some embodiments, referring to FIG. 6, in a multimode multiband wireless device 600, the broadband power amplifier 310 and the broadband amplifiers 350, 360 and their associated antenna filters 330, 354, 364 are fabricated on a semiconductor substrate 650 such as Gallium Arsenside (GaAs). The inter-stage filters 340, 356, 366 can be implemented on another semiconductor substrate 630. The coexist filters 320, 352, 362 can be implemented on another semiconductor substrate 640. The switches 380-384 can be implemented on another semiconductor substrate.

An advantage of the above described multi-substrate configuration is that only the semiconductor substrate 640 comprising the coexist filters need to be changed to support different network operators or protocols in different countries. This flexibility can significantly lower cost for manufacturing wireless devices. For example, in the 2.3 to 2.7 GHz range, Band 38 is used in the E.U, Band 7 is used in the E.U. and Latin America, Band 40 is used in China and India, and Band 41 is used in the U.S. Semiconductor substrates 640 comprising different coexist filters can be used for different regions.

In some embodiments, still referring to FIG. 6, the inter-stage filters 340, 356, 366 and the coexist filters 320, 352, 362 can be fabricated on a semiconductor substrate 610, whereas the broadband power amplifier 310, the broadband amplifiers 350, 360, the antenna filters 330, 354, 364, and the switches 380-384 can be implemented on another semiconductor substrate 620.

Figure 1B:
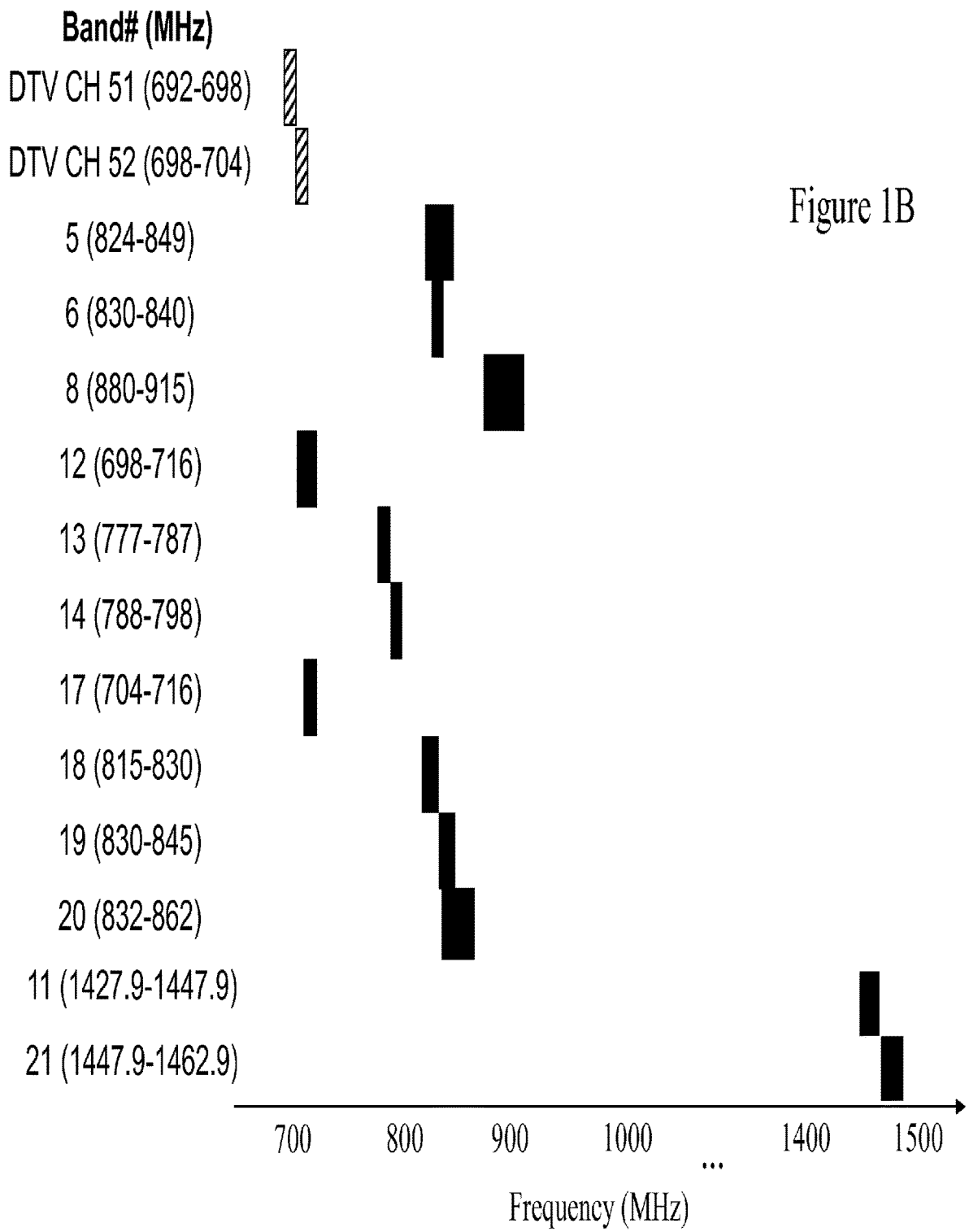
FIG. 1B is a schematic diagram illustrating DTV bands and cellular bands uplink frequency in the 0.7-1.5 GHz range.
Figure 1C:
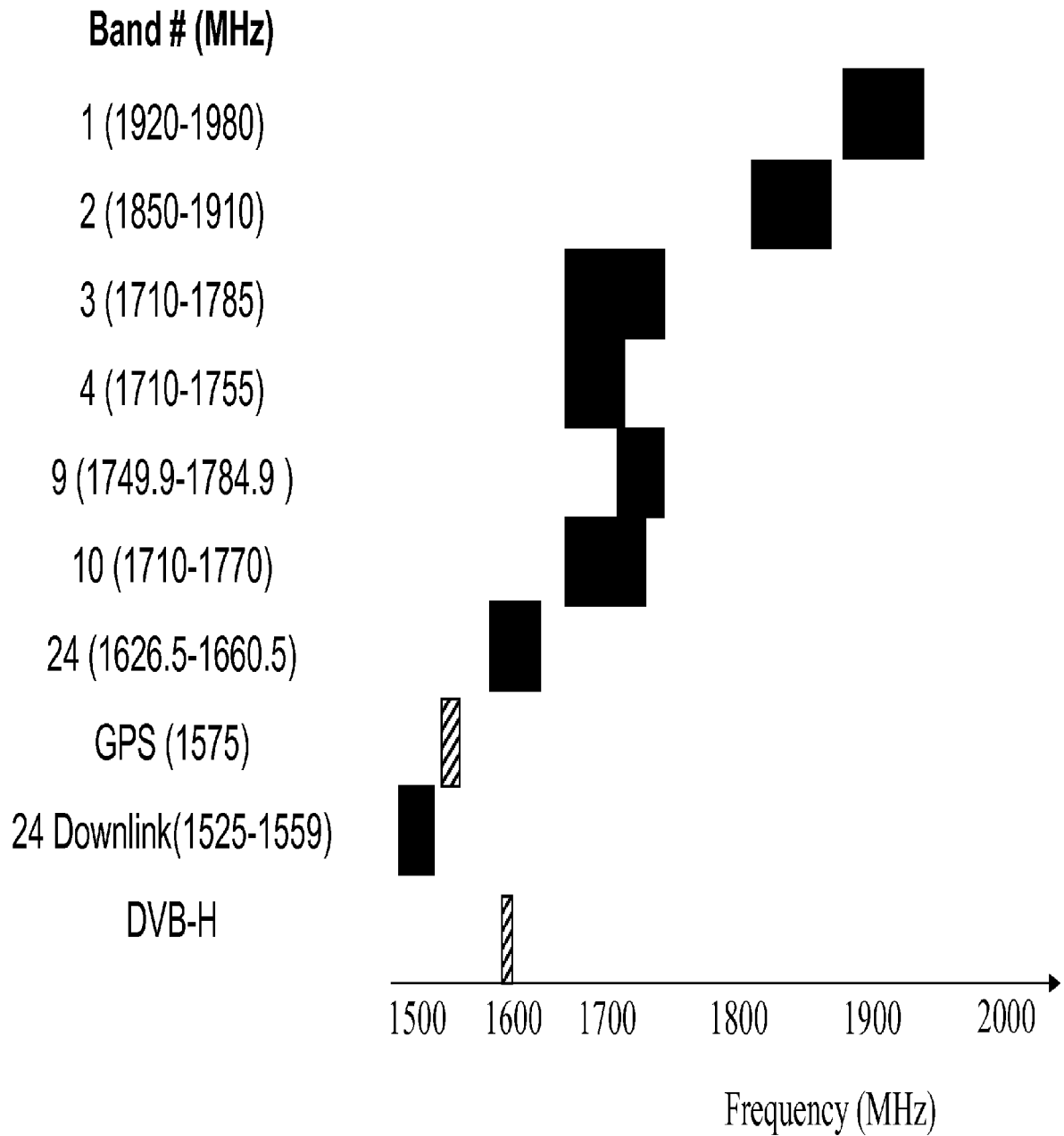
FIG. 1C is a schematic diagram illustrating a GPS band, a DTV band, and cellular bands uplink frequency and band 24 downlink frequency in the 1.5-2.0 GHz range.

The above described multimode multiband wireless devices are compatible with other RF frequency ranges. Different amplifier circuits can be used to cover frequencies ranging from 700 MHz to 3800 GHz. For example, a broadband power amplifier circuit can amplify RF signals in cellular bands from 698 MHz to 915 MHz (herein referred as 1 GHz PA) without interferences with the DTV CH 51 and 52, as shown in FIG. 1B. The coexist filter attenuates noise in the operation frequency range of DTV CH 51 and 52 (692-698 MHz and 698-704 MHz).

Another power amplifier circuit can cover the frequency range from 1427.9 to 1462.9 MHz (herein referred as 1.5 GHz PA), which includes Band 11 (1427.9-1447.9 MHz) and Band 21 (1447.9-1462.9 MHz), as shown in FIG. 1B.

Another power amplifier circuit can amplify cellular RF signals in cellular bands in the frequency range from 1710-1980 MHz or 1626-1980 MHz (herein referred as 2 GHz PA) without interferences with GPS, DVB-H, etc., as shown in FIG. 10. The coexist filter attenuates noise in the operation frequency range of GPS, DVB-H, etc.

Figure 1D:
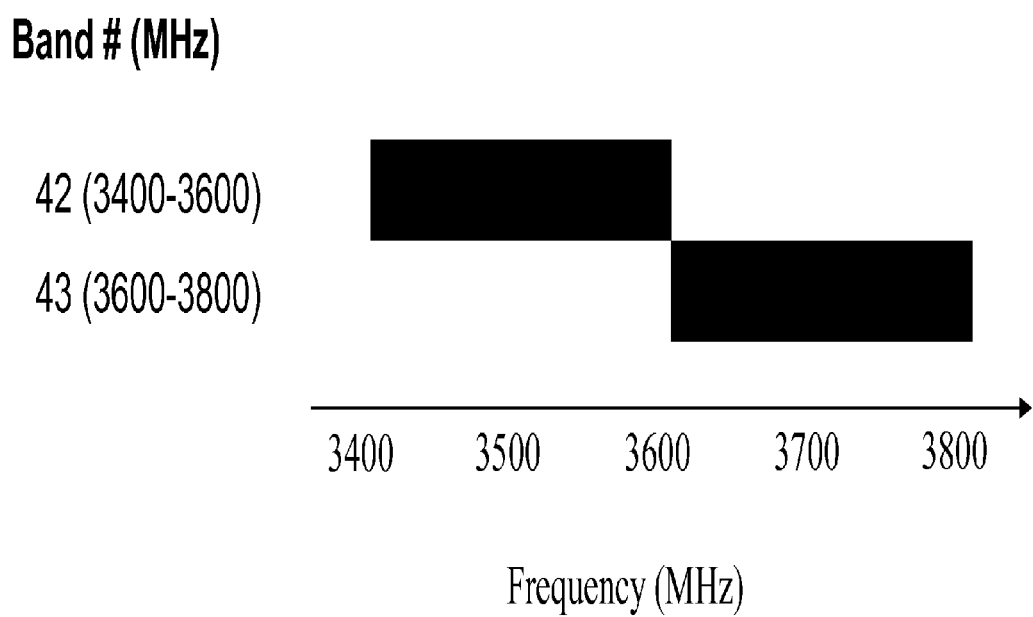

Still another power amplifier circuit can cover the frequency range from 3400 to 3800 MHz (herein referred as 3.5 GHz PA), which includes Band 42 (3400-3600 MHz) and Band 43 (3600-3800 MHz), as shown in FIG. 1D.

A multimode multiband wireless device can provide carrier aggregation. For example, a 1 GHz PA can amplify RF signals in both Band 13 and Band 5 at the same time. Referring to FIG. 7, multiple broadband amplifier circuits 710, 720 can be included in a multimode multiband wireless device 700 in a single wireless device and/or integrated on a single substrate. For example, the multimode multiband wireless device 700 can include the broadband amplifier circuit as a 1 GHz PA and the broadband amplifier circuit as a 2 GHz PA, which together can provide RF amplifications for Band 1 and Band 13 at the same time. In another example, an aggregated broadband amplifier circuit can contain a 1 GHz PA, a 1.5 GHz PA, and a 2 GHz PA, which can provide power amplification for cellular bands residing in the different frequency ranges.

In some embodiments, referring to FIG. 8A, a multimode multiband wireless device 800 includes an interstage filer 805, a broadband power amplifier 810, a switch 820, and coexist filters 831-833 each of which passes RF signals in a different cellular band. The switch 820 can be a multiplexer. For example, the multimode multiband wireless device 800 can be a 2 GHz broadband PA covering the range from 1710 to 1980 MHz. The coexist filters 831-833, as shown in FIGS. 8B and IC, can respectively pass in the Band 4 (1710-1755 MHz), Band 2 (1850-1910 MHz), and Band 1 (1920-1980 MHz). Transmission RF signals are amplified by the broadband power amplifier 810. The coexist filters 831-833 can effectively attenuates noise from GPS and DVB-H bands and other noise outside of frequency of the selected band. The amplified transmission RF signals are directed to one of the coexist filters 831-833 by the switch 820 under the control of a band selection signal. For example, the amplified transmission RF signals are directed through the coexist filter 832 and then to the antenna for wireless transmission.

FIG. 8C illustrates the amplifier output signal and the band pass profile of the broadband power amplifier 810 in FIG. 8A. FIG. 8C shows on the left side, an intended input cellular signal in a cellular band, and interfering noises from WiFi, GPS, DTV, TV or radio band adjacent to the cellular band. The band-pass type coexist filter 831, 832, or 833 has a profile (shown in the middle) that passes the signals in one of the intended cellular bands but attenuates interfering noise in WiFi, GPS, DTV, TV, or FM radio band, which results in the output profile signal only in the intended cellular band, as shown on the rightside.

An advantage of the multimode multiband wireless device 800 is that it can be implemented with reduced cost by adopting broadband power amplifier which reducing the number of power amplifiers required by multiband cellular service. In some embodiments, referring to FIG. 9A, a multimode multiband wireless device 900 with even more bands can be integrated with multiple broadband RF power amplifier circuits 910, 950 based on multiplexing coexist filters. The broadband RF power amplifier circuit 910 includes a broadband power amplifier 920, a multiplexer 930, and coexist filters 940. The broadband RF power amplifier circuit 950 includes a broadband power amplifier 960, a multiplexer 970, and coexist filters 980. The broadband RF power amplifier circuits 910, 950 can function like the multimode multiband wireless device 700 as described above. The multimode multiband wireless device 900 can provide carrier aggregation across different frequency ranges. For example, the broadband RF power amplifier circuit 910 can be a 2 GHz broadband PA covering the range from 1710 to 1980 MHz or 1626 to 1980 MHz. The broadband RF power amplifier circuit 950 can be a 1 GHz broadband PA covering the range from 698 MHz to 915 MHz. In wireless operation, the broadband RF power amplifier circuit 910 can be switched to amplify RF signals in Band 2 (1850-1910 MHz), whereas the broadband RF power amplifier circuit 950 can be simultaneously switched to amplify RF signals in Band 13 (777-787 MHz). The frequency ranges listed above for 1 GHz broadband PA, 2 GHz broadband PA are for illustration purpose, and the exact ranges can be modified suitably for the standards of cellular bands which may evolve from time to time.

FIG. 9B shows a RF power amplifier circuit including multiplexing input RF signals and multiplexing coexist filters in accordance with the present invention. A multimode wireless device 990 includes an input select circuit 992 configured to select a plurality of RF input signals such as RF input 1, RF input 2, under the control of input control signal. The RF input signal selected is input to the broadband power amplifier 991. The amplified RF signal is sent to an output select circuit 993, which can direct the amplified RF signal to one of coexist filters 994, 995 in response to an output control signal. Each of the coexist filters 994, 995 is connected to antenna.

The coexist filters 994, 995 have band profiles covering different RF bands. For example, the coexist filter 994 can have a band pass profile spanning a first cellular band. The coexist filter 995 can have a band pass profile spanning a second cellular band. Alternatively, the coexist filter 995 can have a notch profile rejecting the WiFi band, such as from 2400 MHz to 2483 MHz, or other frequency bands such as GPS, SDARS, digital terrestrial television, etc.

It is understood the disclosed multimode multiband wireless devices can be compatible with other variations without deviating from the spirit of the present application. The multi-band filter can be implemented by different components and under different mechanism from the description above. The disclosed multimode multiband wireless devices can operate in frequency ranges and RF bands different the examples used in the specification. The disclosed broadband power amplifier circuits are suitable to various cellular communication standards, such as 2G, 3G, 4G, Long Term Evolution (LTE), TD-LTE, LTE Advanced, WiMax, WiBro, etc. The frequency ranges of broadband PAs are not limited to the frequency range illustrated above and are subject to revision, as the standards of cellular bands may evolve from time to time.

The substantially high RF complexity associated with wireless RF systems increases the difficulty of miniaturization of the transmission components. For example, each band supported by the communication device would require a separate RF amplifier and in some cases each standard would require an additional amplifiers which in turn raises the overall cost. The modules disclosed herein solves this problem by introducing amplifiers that can cover multiple bands and multiple standards (e.g., 2G, 3G, 4G, 5G, etc.) and can contain other passive and active components such as switches, filters and/or duplexers to reduce the overall size of the RF front end.

In the present disclosure, the term "die" refers to a small area of useful electrical material such as a semiconductor(s) or integrated circuit(s). The term "package" refers to an enclosure for a die (e.g., amplifier) or plurality of dies which are encapsulated (or similarly enclosed). A "module" refers to a unitary device for wireless communications, comprising a package, a plurality of packages, integrated amplifiers and other circuitry and auxiliary electronic components necessary for operation of the amplifiers. The term "device" used herein refers to a broader category of electronics than a module (e.g., RF front end).

FIG. 10A illustrates a functional block diagram of a millimeter wave (mmWave) module 1000 with integrated RF amplifiers 1002 and 1004 which can be used in a radio frequency front end (RFFE) module of a multimode multiband wireless device 250 described above (such as a personal digital assistant (PDA), cellular phone, wireless tablet and the like). These amplifiers 1002 and 1004 may be broadband amplifiers. The RFFE module may include circuitry such as amplifiers, filters, switches, duplexers, antenna tuners, advanced power tracking chips and other front end components however not all the circuitry is shown in the FIGS. 10A-20B that is used in operation. RF amplifiers 1002 and 1004 can be fabricated on a semiconductor substrate 1006. Filters, switches, phase shifters, controllers and other associated elements associated with operation of the amplifiers 1002 and 1004 can also be fabricated on substrate 1006 or on separate substrates. Power amplifier 1002 may be made using Gallium Arsenide (GaAs) Indium Gallium Phosphide (InGaP) Heterojunction Bipolar Transistor (HBT), GaAs pseudomorphic high-electron mobile transistor (PHEMT), GaAs enhancement mode PHEMT (E-PHEMT), Gallium Nitride (GaN), Indium Phosphate (InP), Silicon Germanium (SiGe), complementary metal-oxide-semiconductor (CMOS), Silicon on Insulator (SOI), and other semiconductor process and material technologies to form a transmitting mmWave power amplifier operating in the frequency range of approximately 20 GHz to approximately 300 GHz. Note that in this disclosure that unless referring to a narrower range or single frequency or frequency band, the use of the term "mmWave" frequencies or signals will refer to this 20 GHz to 300 GHz range. Also note that recitation of ranges of values in this specification are merely intended to serve as a shorthand method of referring individually to each separate value falling within the range, unless otherwise indicated herein, and each separate value is incorporated into this specification as if it were individually recited herein. Therefore, any given numerical range shall include whole and fractions of numbers within the range. For example, the range "1 to 10" shall be interpreted to specifically include whole numbers between 1 and 10 (e.g., 1, 2, 3, . . . 9) and non-whole numbers (e.g., 1.1, 1.2, . . . 1.9). The words "approximately", "about" or "substantially" when accompanying a numerical value, are to be construed as indicating a deviation of up to and inclusive of plus or minus 20% from the stated numerical value. FIG. 10A also shows low noise amplifier (LNA) 1004 which may be used to receive mmWave signals. LNA 1004 is particularly sensitive to weak signals. LNA 1004 could be made using GaAs InGaP HBT, PHEMT, E-PHEMT, GaN, InP, SiGe, CMOS, SOI or other semiconductor processes and/or materials.

FIG. 10B illustrates a functional block diagram of another embodiment of a mmWave module 1010 which has semiconductor substrate 1012 with at least two power amplifiers 1002 and two low noise amplifiers 1004 capable of transmitting and receiving RF signals.

FIG. 11 illustrates a functional block diagram of another embodiment of a mmWave module 1100 on a semiconductor substrate 1102 with multiple integrated power amplifiers 1002. Two amplifiers are shown but there could be more.

FIG. 12 shows a functional block diagram of mmWave modules 1202 and 1204 having semiconductor substrates 1206 and 1208 with integrated amplifiers 1002 and 1004 which can be used in a multimode multiband wireless device 250 described above to send and receive mmWave signals such as approximately 28 GHz and/or 39 GHz. Alternatively, in other embodiments the power amplifier 1002 can also operate at, for example, 60 GHz. Also, integrated into substrates 1206 and 1208 are switches 1210 and 1212 which may be single pole double throw (SP2T), multi pole multi throw (MPMT) or a plurality of SP2T switches. The transmission RF signals are directed from amplifiers 1002 to antenna array 1214 by switches 1210 and 1212. Reception RF signals are received at antenna array 1214 and directed by switches 1210 and 1212 to the LNAs 1004. In some embodiments, the antenna array 1214 is directly connected to the switches 1210 and 1212. As discussed above, modules 1202 and 1204 have power amplifiers 1002 and which transmit in the mmWave range and LNAs 1004 used to receive mmWave signals. Antenna array 1214 is a mmWave antenna array and can be in the form of a one-dimensional array of antennas 1214a, two-dimensional array, omnidirectional or other types of antennas. Reference 1218 indicates the hardline connection between modules 1202 and 1204 and the antenna array 1214. In this embodiment, modules 1202 and 1204 and antenna elements 1214a all contain different semiconductor substrates. Also, in this embodiment, RF amplifiers 1002 and 1004 in module 1202 operate at a first mmWave frequency (e.g., one of approximately 24 GHz, 28 GHz, 39 GHz or 60 GHz) which is the same as a second frequency (e.g., one of approximately 24 GHz, 28 GHz, 39 GHz or 60 GHz) that amplifiers 1002 and 1004 in module 1204 operate at.

In FIG. 13 shows a functional block diagram of a mmWave module 1300 which operates in a manner similar to the embodiment shown in FIG. 12. In this embodiment, however, the power amplifiers 1002, LNAs 1004 and switches 1210 and 1212 are located on the same semiconductor substrate. Switches 1210 and 1212 are connected to an antenna array 1314 made up of antenna elements 1316 arranged in a two-dimensional configuration and operating at the same frequency (e.g., one of approximately 24 GHz, 28 GHz, 39 GHz or 60 GHz). In an alternative embodiment, power amplifier 1002, LNA 1004 and switch 1210 could be located on a first semiconductor substrate while a power amplifier 1002, LNA 1004 and switch 1212 could be located on a second semiconductor substrate.

FIG. 14A illustrates a functional block diagram a mmWave module 1400 with multiple integrated power amplifiers and LNAs operates in a manner similar to the embodiments shown in FIGS. 12 and 13. However, this embodiment operates with two amplifiers 1002 and 1004 operating in a first frequency different than a second frequency of the other amplifiers 1002 and 1004. Antenna array 1414 is made up of two arrays operating at the first and second frequencies. A first array is made up of first frequency antenna elements 1416 operate at the first frequency (e.g., one of approximately 24 GHz, 28 GHz, 39 GHz or 60 GHz) and the second array is made up second frequency antenna elements 1418 operating at a second, different frequency. Although two sets of power amplifiers and LNAs are shown, there could be more in the module 1400 (e.g., 4 power amplifiers and 4 corresponding LNAs). FIG. 14B shows an alternative embodiment to FIG. 14A. In this embodiment, first frequency antenna elements 1419 are in a separate substrate 1415 from the second frequency antenna elements 1422 which are in their own different substrate 1420.

FIG. 15A shows a top perspective view of the arrangement of the power amplifiers, LNAs and switches forming a top layer 1502 and antenna array elements forming a bottom layer 1504 of an integrated antenna and amplifier module 1400. The top layer 1502 and bottom layer 1504 are electrically coupled and are either in direct contact or with another layer in between. In some embodiments, the amplifiers are in direct electrical contact with the elements of the antenna array. In the embodiment shown in FIG. 15A, the amplifiers 1002 and 1004 are in separate packages but may be combined in a single package along with switches, phase shifters, gain controllers and/or filters. Top layer 1502 may further contain switches 1210 and 1212. FIG. 15B shows the module 1400 from a bottom layer 1504 view with various antenna elements shown. In some embodiments antenna elements 1416 and 1418 may operate at the same frequency and in other embodiments at different frequencies.

FIG. 16 illustrates a functional block diagram showing mmWave modules 1600 and 1601 operating in a manner similar to the embodiment shown in FIG. 14 however in this embodiment integrated amplifier 1002 and LNA 1004 of module 1601 operate in millimeter wave frequencies and integrated amplifier 1002 and LNA 1004 of module 1600 operate in microwave frequencies (e.g., 400 MHz to 20 GHz). They are connected to switches 1210 and 1212. Antenna array module 1606 has at least one antenna element 1606a and may have four or more antenna elements 1606a and it operates at mmWave frequencies. Antenna 1608 operates in microwave frequencies. In alternative embodiments, modules 1600 and 1601 could be on the same substrate to from a single module.

FIG. 17A illustrates a functional block diagram of a mmWave module 1700 with multiple integrated LNAs 1004 with corresponding antennas 1704. Module 1700 further includes an input/output (I/O) controller 1706 which turns on and off the amplifiers 1004 to control inputs and outputs to module 1700. FIG. 17B illustrates a functional block diagram of another embodiment of mmWave module 1700 with multiple integrated power amplifiers 1002 with corresponding antennas 1704. FIG. 17C illustrates a functional block diagram of another embodiment of mmWave module 1700 with multiple integrated power amplifiers 1002 and LNAs 1004 with corresponding antennas 1704. In this embodiment, I/O controller 1706 turns on and off amplifiers 1002 and 1004 to control inputs and outputs to module 1700. FIG. 17D shows a perspective structural view of module 1700 and illustrates that it is a semiconductor amplifier substrate made up of multiple layers of semiconductor materials and epoxy. Top layer 1700a has power amplifiers 1002, LNAs 1004 or both (depending which embodiment of module 1700 is in place) and bottom layer 1700b has antennas 1704 (shown in dotted lines) arranged in an array on the opposite side 1700c of the bottom layer 1700b. The dimensions of the top layer 1700a and bottom layer are substantially the same. Top layer 1700a may be made of GaAs, CMOS, Silicon Germanium (SiGe), SOI and bottom layer 1700b may be thin-film, LTC, or silicon-base. FIG. 17E shows another perspective structural view of another embodiment of the physical module 1700 which forms an RFFE. Note the top layer 1700a in this embodiment has different, smaller dimensions (or area) than lower layer 1700b so that the antennas 1704 are exposed.

FIG. 18 illustrates a functional block diagram of a plurality of integrated components all located on the same substrate 1800 in the same package. Power amplifiers 1002, LNAs 1004, phase shifters 1802, and gain controllers 1804 all operate at mmWave frequencies. I/O controller 1806 controls the amplifiers 1002, LNAs 1004, phase shifters 1802 and gain controllers 1804. Phase controller 1812 controls phase shifters 1802 for beam forming of mmWaves emitting from the antenna array. Splitters 1808 split the RF signals either to or from amplifiers 1002 and 1004. Antennas 1810 operate to transmit and received mmWave signals.

FIG. 19A illustrates a functional block diagram of a substrate 1900 operating similar to the embodiment of FIG. 18. Substrate 1900 includes splitters 1808 which divide the input RF signal among phase shifters 1802 and gain controllers 1804 the multiple associated power amplifiers 1002. Phase controller 1812 controls phase shifters 1802 for beam forming of mmWaves emitting from the antenna array. The power amplifiers are coupled with a second substrate 1904 which contains a plurality of integrated antenna elements 1906 operating in mmWave frequencies. FIG. 19B illustrates a functional block diagram of another embodiment of substrate 1900 also operating similar to the embodiment of FIG. 18. Substrate 1900 in this embodiment includes a plurality of LNAs 1004 operating in mmWave frequencies receiving RF signals from the plurality of antenna elements 1906 on a second substrate 1904.

FIG. 20A illustrates a functional block diagram of a mmWave transmitter which operates similar to the embodiments of FIGS. 18 and 19. Power amplifier module 2000 having one or more power amplifiers 1002 is coupled with beam control module 2002 on a separate substrate than power amplifier module 2000. Power amplifier module 2000 is also connected to antenna array module 1904 also on a separate substrate. Beam control module 2002 is controlled by phase controller 1812 and the power amplifier module is controlled by I/O controller 2008. Phase controller 1812 controls phase shifters 1802 for beam forming of mmWaves emitting from the antenna array. FIG. 20B is similar to FIG. 20A except in this embodiment module 2000 is made up of multiples LNAs 1004 to receive RF signals from the antenna array.

Specific details are given in the description to provide a thorough understanding of the embodiments. However, embodiments may be practiced without these specific details. For example, well-known processes, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Also, some embodiments were described as processes. Although these processes may describe the operations as a sequential process, many of the operations can be performed in parallel or concurrently. In addition, the order of the operations may be rearranged. A process may have additional steps not included in the figures. Also, a number of steps may be undertaken before, during, or after the above elements are considered.

Having described several embodiments, various modifications, alternative constructions, and equivalents may be used without departing from the spirit of the disclosure. For example, the above elements may merely be a component of a larger system, wherein other rules may take precedence over or otherwise modify the application of the invention. Accordingly, the above description does not limit the scope of the disclosure.

Devices that are described as in "communication" with each other or "coupled" to each other need not be in continuous communication with each other or in direct physical contact, unless expressly specified otherwise. On the contrary, such devices need only transmit to each other as necessary or desirable, and may actually refrain from exchanging data most of the time. For example, a machine in communication with or coupled with another machine via the Internet may not transmit data to the other machine for long period of time (e.g. weeks at a time). In addition, devices that are in communication with or coupled with each other may communicate directly or indirectly through one or more intermediaries.

Although process (or method) steps may be described or claimed in a particular sequential order, such processes may be configured to work in different orders. In other words, any sequence or order of steps that may be explicitly described or claimed does not necessarily indicate a requirement that the steps be performed in that order unless specifically indicated. Further, some steps may be performed simultaneously despite being described or implied as occurring non-simultaneously (e.g., because one step is described after the other step) unless specifically indicated. Moreover, the illustration of a process by its depiction in a drawing does not imply that the illustrated process is exclusive of other variations and modifications thereto, does not imply that the illustrated process or any of its steps are necessary to the embodiment(s), and does not imply that the illustrated process is preferred. Where a process is described in an embodiment the process may operate without any user intervention.

What is claimed is:

1. A radio frequency (RF) wireless module comprising:
    a semiconductor amplifier substrate having at least one RF power amplifier which is configured to operate in the range of 20 GigaHertz (GHz) to 300 GHz and which is coupled to an antenna substrate;
    wherein the antenna substrate has a plurality of antenna elements arranged in at least one first row and configured to receive signals from the RF power amplifier;
    a phase controller for controlling phase shifters for beam forming of a first electromagnetic wave beam emitting from the plurality of antenna elements; and
    wherein the semiconductor amplifier substrate and the antenna substrate are arranged in a stack.

2. The module of claim 1, further comprising:
    a plurality of rows of a plurality antenna elements arranged in a two dimensional array.

3. The module of claim 1, further comprising:
    at least one gain controller on the semiconductor amplifier substrate coupled to the at least one RF power amplifier.

4. The module of claim 1, further comprising:
    at least one switch positioned on an output transmitter path side of the at least one RF power amplifier and connected to the plurality of antenna elements.

5. The module of claim 1, further comprising:
    at least one low noise amplifier (LNA) configured to receive and amplify RF signals from the plurality of antenna elements.

6. The module of claim 1, wherein the at least one RF amplifier may be from the group consisting of: Gallium Arsenide (GaAs) Indium Gallium Phosphide (InGaP) Heterojunction Bipolar Transistor (HBT), GaAs pseudomorphic high-electron mobile transistor (PHEMT), GaAs enhancement mode PHEMT (E-PHEMT), Gallium Nitride (GaN), Indium Phosphate (InP), Silicon Germanium (SiGe), complementary metal-oxide-semiconductor (CMOS), and Silicon on Insulator (SOI).

7. The module of claim 1, wherein the plurality of antenna elements further configured to send signals to a plurality of low noise amplifiers (LNA); and
    the phase controller further configured for receiving a second electromagnetic wave beam from the plurality of antenna elements.

8. A radio frequency (RF) wireless module comprising:
    a semiconductor amplifier substrate having a first set of RF power amplifiers operating at a first frequency and a second set of RF power amplifiers operating at a different second frequency and coupled to an antenna substrate;
    wherein the antenna substrate has a plurality of first antenna elements arranged in a first array and coupled to the first set of RF power amplifiers and a plurality of second antenna elements arranged in a second array and coupled to the second set of RF power amplifiers, wherein the first antenna array is nested inside the second antenna array and the first antenna elements are configured to receive signals from the first set of RF power amplifiers and form a first electromagnetic wave beam and the second antenna elements are configured to receive signals from the second set of RF power amplifiers and form a second electromagnetic wave beam;
    a phase controller for controlling phase shifters for beam forming of the first and second electromagnetic wave beams emitting from the first and second antenna arrays; and
    wherein the semiconductor amplifier substrate and the antenna substrate are arranged in a stack.

9. The module of claim 8, wherein the first and second set of RF amplifiers operate in the range of 20 Gigahertz (GHz) to 300 GHz.

10. The module of claim 8, further comprising:
    at least one switch positioned on an output transmitter path side of the first and second set of RF power amplifiers and connected to the first and second plurality of antenna elements.

11. The module of claim 8, further comprising:
    a first and second set of low noise amplifiers (LNA) configured to receive and amplify RF signals from the first and second plurality of antenna elements.

12. The module of claim 8, wherein the semiconductor amplifier substrate is from the group consisting of: Gallium Arsenide (GaAs) Indium Gallium Phosphide (InGaP) Heterojunction Bipolar Transistor (HBT), GaAs pseudomorphic high-electron mobile transistor (PHEMT), GaAs enhancement mode PHEMT (E-PHEMT), Gallium Nitride (GaN), Indium Phosphate (InP), Silicon Germanium (SiGe), complementary metal-oxide-semiconductor (CMOS), and Silicon on Insulator (SOI).

13. The module of claim 8, wherein the semiconductor amplifier substrate has less area than the antenna substrate which allows the plurality of antennas elements to be exposed.

14. The module of claim 8, further comprising:
    first and second set of gain controllers on the semiconductor amplifier substrate coupled to the first and second set of RF power amplifiers.

15. The module of claim 8, further comprising:
first and second set of gain controllers on the semiconductor amplifier substrate coupled to the first and second set of RF power amplifiers.

16. A radio frequency (RF) wireless module comprising:
a semiconductor amplifier substrate having a first set of RF power amplifiers operating at a first frequency and a second set of RF power amplifiers operating at a different second frequency;
a plurality of switches positioned on an output transmitter path side of the first set of RF power amplifiers and the second set of RF power amplifiers;
wherein an antenna substrate has a plurality of antenna elements configured to receive signals from the plurality of switches;
first and second phase controllers for controlling phase shifters for beam forming of electromagnetic wave beams emitting from the plurality of antenna elements; and
wherein the semiconductor amplifier substrate and the antenna substrate are arranged in a stack.

17. The module of claim 16, wherein the plurality antenna elements arranged in a two dimensional array.

18. The module of claim 16, wherein the first and second set of RF amplifiers operate in the range of 20 Gigahertz (GHz) to 300 GHz.

19. The module of claim 16, further comprising:
a first and second set of low noise amplifiers (LNA) configured to receive and amplify RF signals from the plurality of antenna elements.

20. The module of claim 16, wherein the semiconductor amplifier substrate has less area than the antenna substrate which allows the plurality of antennas elements to be exposed.

* * * * *